(12) United States Patent
Kim et al.

(10) Patent No.: US 11,390,941 B2
(45) Date of Patent: Jul. 19, 2022

(54) MANUFACTURING METHOD OF RADIO WAVE TRANSMITTABLE SENSOR COVER HAVING MICRO CRACK AND LASER HOLE AND RADIO WAVE TRANSMITTABLE SENSOR COVER MANUFACTURED USING THE SAME

(71) Applicant: Byoung Sam Kim, Anyang-si (KR)

(72) Inventors: Byoung Sam Kim, Ansan-si (KR); Jong Jun An, Incheon (KR); Jae Kyung Chun, Siheung-si (KR)

(73) Assignee: Byoung Sam Kim, Ansan-si (KR)

( * ) Notice: Subject to any disclaimer, the term of this patent is extended or adjusted under 35 U.S.C. 154(b) by 354 days.

(21) Appl. No.: 16/083,378

(22) PCT Filed: Mar. 28, 2018

(86) PCT No.: PCT/KR2018/003676
§ 371 (c)(1),
(2) Date: Sep. 7, 2018

(87) PCT Pub. No.: WO2018/186621
PCT Pub. Date: Oct. 11, 2018

(65) Prior Publication Data
US 2020/0299831 A1 Sep. 24, 2020

(30) Foreign Application Priority Data
Apr. 7, 2017 (KR) .................. 10-2017-0045459

(51) Int. Cl.
*C23C 14/20* (2006.01)
*C23C 14/58* (2006.01)
(Continued)

(52) U.S. Cl.
CPC ........ *C23C 14/5806* (2013.01); *C23C 14/024* (2013.01); *C23C 14/0629* (2013.01);
(Continued)

(58) Field of Classification Search
CPC .............. C23C 14/024; C23C 14/0623; C23C 14/0629; C23C 14/083; C23C 14/18;
(Continued)

(56) References Cited

U.S. PATENT DOCUMENTS

| 5,104,480 A * | 4/1992 | Wojnarowski ....... H01C 17/242 216/65 |
| 8,927,069 B1 * | 1/2015 | Estinto .................... C03C 17/36 427/555 |

(Continued)

FOREIGN PATENT DOCUMENTS

| JP | 3366299 B2 | 1/2003 |
| JP | 2008-060350 A | 3/2008 |

(Continued)

OTHER PUBLICATIONS

Paul A. Tipler; Physics; worth publishers, Inc.; New York, NY; 1976 (no month); excerpt p. 609.*

(Continued)

*Primary Examiner* — Jose I Hernandez-Kenney
(74) *Attorney, Agent, or Firm* — Novick, Kim & Lee, PLLC; Jae Youn Kim; Jihun Kim

(57) ABSTRACT

Provided is a radio wave transmittable laminate, which includes a substrate; a primer coating layer located on an upper surface of the substrate and including a polymer resin; a metal layer located on an upper surface of the primer coating layer and made of a metal; a plurality of micro cracks formed in the metal layer so as to transmit radio waves; and a hole pattern constituted by a plurality of holes which vertically penetrate the metal layer so as to transmit the radio waves.

8 Claims, 19 Drawing Sheets

(51) Int. Cl.
  *C23C 16/06* (2006.01)
  *C23C 16/48* (2006.01)
  *C23C 16/56* (2006.01)
  *H01Q 1/42* (2006.01)
  *C23C 14/02* (2006.01)
  *C23C 14/06* (2006.01)
  *C23C 14/08* (2006.01)
  *C23C 14/30* (2006.01)
  *C23C 16/30* (2006.01)
  *C23C 16/40* (2006.01)

(52) U.S. Cl.
  CPC ............ *C23C 14/083* (2013.01); *C23C 14/20* (2013.01); *C23C 14/30* (2013.01); *C23C 14/5813* (2013.01); *C23C 14/5873* (2013.01); *C23C 16/06* (2013.01); *C23C 16/306* (2013.01); *C23C 16/405* (2013.01); *C23C 16/483* (2013.01); *C23C 16/56* (2013.01); *H01Q 1/421* (2013.01)

(58) Field of Classification Search
  CPC ......... C23C 14/20; C23C 14/30; C23C 14/58; C23C 14/5806; C23C 14/5813; C23C 14/5873; C23C 16/06; C23C 16/306; C23C 16/405; C23C 16/483; C23C 16/56; H01Q 1/3233; H01Q 1/421; H01Q 15/0013
  USPC ....... 427/546, 555, 556, 566, 567, 576, 524, 427/587, 593, 124, 126.1, 126.2, 126.3, 427/250, 252.253, 255.31, 374.1, 374.3, 427/376.6, 376.7, 380
  See application file for complete search history.

(56) References Cited

U.S. PATENT DOCUMENTS

| | | | |
|---|---|---|---|
| 2003/0152787 | A1* | 8/2003 | Arakawa ............... G02B 5/3058 428/457 |
| 2005/0037278 | A1* | 2/2005 | Koishikawa ............ C03C 17/36 430/270.1 |
| 2009/0283200 | A1* | 11/2009 | Nakamura .......... B32B 38/0036 156/64 |
| 2010/0304065 | A1* | 12/2010 | Tomantschger ........ B32B 27/38 428/35.8 |
| 2014/0176836 | A1* | 6/2014 | Brecht .............. G02F 1/133553 349/16 |
| 2016/0133598 | A1* | 5/2016 | Baudin ................... H01L 24/83 257/777 |
| 2018/0009143 | A1* | 1/2018 | Abe ...................... H05K 5/0243 |

FOREIGN PATENT DOCUMENTS

| | | |
|---|---|---|
| JP | 2010-005999 A | 1/2010 |
| JP | 5465030 B2 | 4/2014 |
| KR | 10-2017-0035773 A | 3/2017 |
| WO | WO-2016125212 A1 * | 8/2016 ............... H05K 5/04 |

OTHER PUBLICATIONS

Machine translation (ESpaceNet) of JP 2011-163903 A (published Aug. 25, 2011) = JP 5465030 B2 (published Apr. 9, 2014), by Watanabe Mitsuhiro et al.*

Machine translation (ESpaceNet) of JP 2010-005999 A, published Jan. 14, 2010, by Medea Tetsuhiro et al.*

Machine translation (ESpaceNet) of KR 20170035773 A, published Mar. 31, 2017, by Kim Hun Rae.*

* cited by examiner

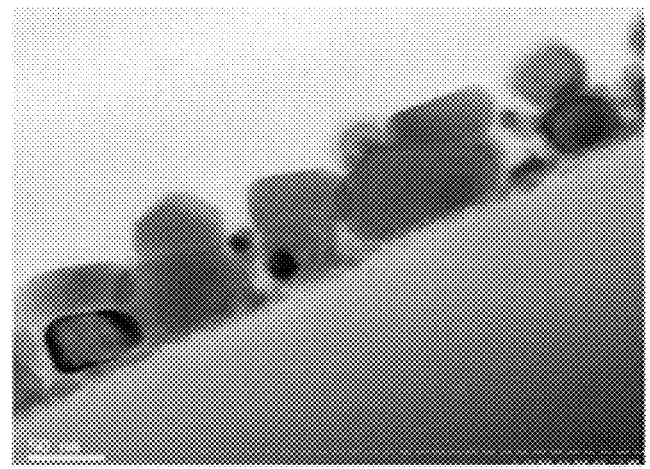
Fig. 6(a)
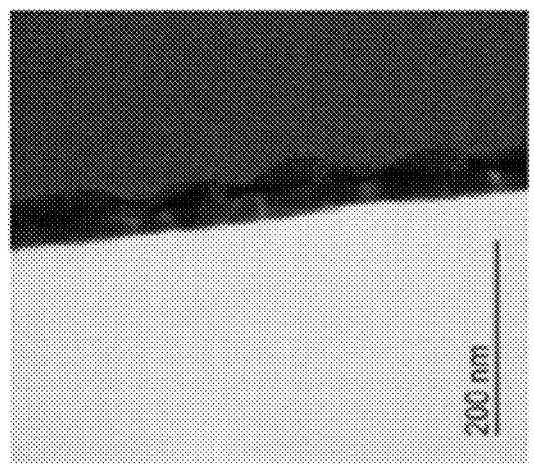 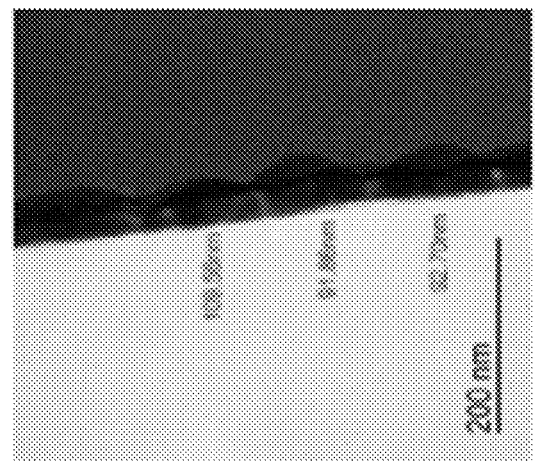
Fig. 6(b1)          Fig. 6(b2)
PRIOR ART

MANUFACTURING METHOD OF RADIO WAVE TRANSMITTABLE SENSOR COVER HAVING MICRO CRACK AND LASER HOLE AND RADIO WAVE TRANSMITTABLE SENSOR COVER MANUFACTURED USING THE SAME

TECHNICAL FIELD

The present invention relates to a manufacturing method of a radio wave transmittable sensor cover and a radio wave transmittable sensor cover manufactured using the same, and more particularly, to a radio wave transmittable sensor cover including micro cracks and laser holes, which corresponds to International Classification No. B32B5.

BACKGROUND ART

Smart cruise control (SCC) is a system that measures a distance and a relative speed from a front vehicle by using sensors mounted on a front of a vehicle to maintain an appropriate distance from the front vehicle and an appropriate speed.

FIG. 1 is an exemplary diagram showing a vehicle on which the sensor 2 is mounted. Since the sensor 2 is mounted inside the front of the vehicle, a sensor cover capable of covering the sensor 2 can be installed on a front grill 3 or on a rear surface of an emblem 4. Further, the sensor cover may become the emblem 4 itself.

FIGS. 2(a) and 2(b) show a state in which the sensor cover 1 is installed. In FIGS. 2(a) and 2(b), the sensor cover 1 is indicated by a thick line. In FIG. 2(a), the sensor cover 1 is installed at the center of the front grill 3 and in FIG. 2(b), the sensor cover 1 itself is the emblem.

The sensor cover covers an antenna of the sensor and protects the antenna from collision, debris, wind pressure, and the like. Therefore, the sensor cover needs have a strength and weather resistance for protecting the antenna of the sensor from external factors. In addition, the sensor cover needs to be capable of transmitting radio waves transmitted and received by the antenna of the sensor.

FIG. 3 shows a state in which a radio wave L1 transmitted by the antenna of the sensor 2 reaches a front vehicle 5 by penetrating the sensor cover 1 and thereafter, a radio wave L2 reflected on the front vehicle 5 reaches the antenna of the sensor 2 by penetrating the sensor cover 1. Usually, a reference propagation attenuation rate is −1.5 dB to less than and 0 dB at a frequency of 76 to 77 GHz. However, since a propagation rate deviation within the same frequency is allowed up to 0.3 dB, the reference propagation attenuation rate can be −1.8 dB to less than 0 dB at 76 to 77 GHz.

The sensor cover needs to have continuity with surroundings. Referring to FIGS. 2(a) and 2(b), a color of the front grill 3 is usually a dark color series and/or a bright color series. Further, the front grill 3 is generally glossy and has a metallic texture. Therefore, in general, the sensor cover 1 also exhibits the color of dark color series and/or bright color series and has continuity with the surrounding front grill 3 only when the sensor cover 1 is glossy. Specifically, in FIG. 2(a), since an X' portion of the front grill 3 is dark in color and glossy, it is preferable that an X portion of the sensor cover 1 is also a dark color and glossy. Further, in FIG. 2(a), since a Y' portion of the front grill 3 is bright in color and glossy, it is preferable that a Y portion of the sensor cover 1 is also a bright color and glossy. In general, a material that contributes to the dark or light color and gloss is metal. Therefore, the sensor cover 1 may include the metal.

Most metals, however, have a continuous structure and are highly conductive, making it difficult to transmit the radio waves. However, some metals with poor radio wave transmissivity exist.

Japanese Patent Registration No. 3366299 (Patent Document 1) discloses a sensor cover including indium. Indium can transmit the radio wave of the sensor while contributing to the glossiness of the sensor cover with the dark color or bright color. In addition to indium, tin and gallium are used as the material of the sensor cover because of the radio wave transmissivity.

FIG. 4 is an exemplary view showing an island structure of a conventional sensor cover. Referring to FIG. 4, the sensor cover 1 in the related art includes a substrate 10 and a metal layer 20 located on the substrate 10. The metal layer 20 is made of indium, tin, or gallium. Indium, tin, or gallium is deposited on the substrate 10 to form the metal layer 20. Indium, tin, or gallium grows while forming an island structure during deposition. As shown in FIG. 4, the island structure which is the structure of the metal layer 20 is a non-continuous structure. Therefore, the metal layer 20 made of indium, tin, or gallium is very low in conductivity and can transmit the radio waves. A cause for forming the island structure is described as condensation characteristics of the deposited material and a shadow effect between growing islands.

FIGS. 5(a) and 5(b) are SEM images showing an example of the surface of the conventional sensor cover. FIGS. 6(a), 6(b1), and 6(b2) are SEM images showing an example of a cross section of the conventional sensor cover. FIGS. 7(a), 7(b1), and 7(b2) are AFM images showing an example of a surface of the conventional sensor cover. Referring to FIGS. 5 to 7, it is confirmed that the metal layer in the related art, which is made of indium, tin or gallium has the island structure and has the radio wave transmissivity.

However, the materials such as indium, tin, and gallium are expensive and have limited reserves. Above all, it is difficult to ensure reliability such as oxidation resistance, water resistance, light resistance, etc., even if the materials ensure continuity with the front grill and radio wave transmissivity.

CITATION LIST

Patent Literature

Patent Literature 1

Japanese Patent Registration No. 3366299

SUMMARY OF INVENTION

Technical Problem

In order to solve the above problems, an object of the present invention is to artificially implement an island structure in the related art by forming micro cracks in a metal layer. Further, an object of the present invention is to implement a more stable island structure by further securing a space between islands by forming a hole pattern by laser punching in the metal layer with the micro cracks. In other words, an object of the present invention is to provide a radio wave transmittable laminate which has no limitation of a material of the metal layer. Since the metal layer is made of a metal, the metal layer exhibits a dark color, a bright color, and gloss. In addition, the metal layer is made of the metal, but the metal is radio wave-transmittable due to the micro cracks and/or the hole pattern. Thus, the metal layer material is not limited to indium, tin, or gallium in the related art.

The objects to be achieved by the present invention are not limited to the aforementioned objects, and other objects, which are not mentioned above, will be apparent to a person having ordinary skill in the art from the following description.

Solution to Problem

In order to achieve the above objects, a configuration of a manufacturing method of a radio wave transmittable sensor cover including micro cracks and laser holes of the present invention is as follows.

An exemplary embodiment of the present invention provides a manufacturing method of a radio wave transmittable sensor cover including micro cracks and laser holes, the manufacturing method including: (a) preparing a substrate made of a transparent material; (b) forming a primer coating layer to be located on the upper surface of the substrate by a method of coating, dipping or spraying a mixture containing a polymer resin; and (c) forming a metal layer having an island structure to be located on the upper surface of the primer coating layer by a physical vapor deposition or chemical vapor deposition method, in which the metal layer formed in step (c) is deposited and formed on the primer coating layer at a first temperature, the substrate with the metal layer and the primer coating layer is heat-treated at a second temperature relatively lower than the first temperature after deposition of the metal layer, and as a result, micro cracks are formed on the metal layer by a difference in thermal stress between the substrate and the metal layer, and a hole pattern including a plurality of holes which are vertically penetrated by laser punching is formed to correspond to a thickness of the metal layer with the micro cracks to remove bindings between the columnar crystals of the metal layer, and the plurality of holes forming the hole pattern by the laser punching are regularly arranged so as to have predetermined hole diameters and spaces between holes, to have a propagation attenuation rate that is relatively larger than −1.8 dB in an radio wave wavelength region of 76 to 77 GHz and high radio wave transmissivity.

A line width of the micro crack may be 0.1 to 80 μm

A space between the micro cracks facing each other among the plurality of micro cracks may be 5 to 1000 μm.

A diameter of the hole may be 1 to 200 μm.

Spaces between the plurality of holes may be 5 to 1000 μm

A thickness of the metal layer may be 1 to 100 nm.

The metal layer may be formed by depositing the metal by physical vapor deposition or chemical vapor deposition.

The laminate constituted by the substrate, the primer coating layer, and the metal layer may be heat-treated at a temperature lower than a deposition temperature of the metal after forming the metal layer so that the plurality of micro cracks is formed.

A difference between the deposition temperature and the heat treatment temperature may be 10° C. or higher.

The metal may be a hard metal.

The hole pattern may be formed by laser punching.

The radio wave transmittable sensor cover may further include a chromium oxide layer which is located on the upper surface of the metal layer and made of chromium oxide.

The radio wave transmittable sensor cover may further include a black shield coating layer which is located on the upper surface of the chromium oxide layer and made of a black pigment.

Another exemplary embodiment of the present invention provides a manufacturing method of a radio wave transmittable sensor cover including micro cracks and laser holes, the manufacturing method including: (i) preparing a substrate made of a transparent material; (ii) forming a primer coating layer to be located on the upper surface of the substrate by a method of coating, dipping or spraying a mixture containing a polymer resin; (iii) forming a crack inducing layer including a plurality of first micro cracks which is located on the upper surface of the primer coating layer and made of zinc sulfide or zinc selenide; and (iv) forming a metal layer having an island structure to be located on the upper surface of the crack inducing layer by a physical vapor deposition or chemical vapor deposition method, in which the metal layer formed in step (iv) is deposited and formed on the primer coating layer at a first temperature, the substrate with the metal layer and the primer coating layer is heat-treated at a second temperature relatively lower than the first temperature after deposition of the metal layer, and as a result, a plurality of second micro cracks are formed on the metal layer by a difference in thermal stress between the substrate and the metal layer, and a hole pattern including a plurality of holes which are vertically penetrated by laser punching is formed to correspond to a thickness of the metal layer with the second micro cracks to remove bindings between the columnar crystals of the metal layer, and the plurality of holes forming the hole pattern by the laser punching are regularly arranged so as to have predetermined hole diameters and spaces between holes, to have a propagation attenuation rate that is relatively larger than −1.8 dB in an radio wave wavelength region of 76 to 77 GHz and high radio wave transmissivity.

Advantageous Effects of Invention

According to the exemplary embodiment of the present invention having the above configuration, bindings between columnar crystals are broken by forming micro cracks and/or a hole pattern artificially in a metal layer having a columnar structure formed by binding columnar crystals to implement an island structure in the related art. Accordingly, the radio wave transmittable laminate including the metal layer may transmit radio waves. Thus, a metal having high conductivity (metal having no radio wave transmissivity) may be used as the metal layer material. Further, a metal having a rich metal content, a metal having a low price, a metal having excellent reliability such as oxidation resistance, water resistance, light resistance and strength, etc. may be used as the metal layer material. In other words, the metal layer material is not limited to conventional indium, tin, or gallium, and any metal may be used as the metal layer material.

The radio wave transmittable laminate including the metal layer exhibits a dark color or bright color because the metal layer is composed of a metal, and has a metallic texture due to gloss. That is, the radio wave transmittable laminate has radio wave transmissivity and continuity with a surrounding front grill.

Further, according to the exemplary embodiment of the present invention, the radio wave transmittable laminate having both the micro cracks and the hole pattern is excellent in radio wave transmissivity as compared with the case where the radio wave transmittable laminate is provided with either micro cracks or a hole pattern.

BRIEF DESCRIPTION OF DRAWINGS

FIGS. 6(a), 6(b1) and 6(b2) are TEM images showing examples of a cross section of the conventional sensor cover.

DESCRIPTION OF EMBODIMENTS

Figure 1:
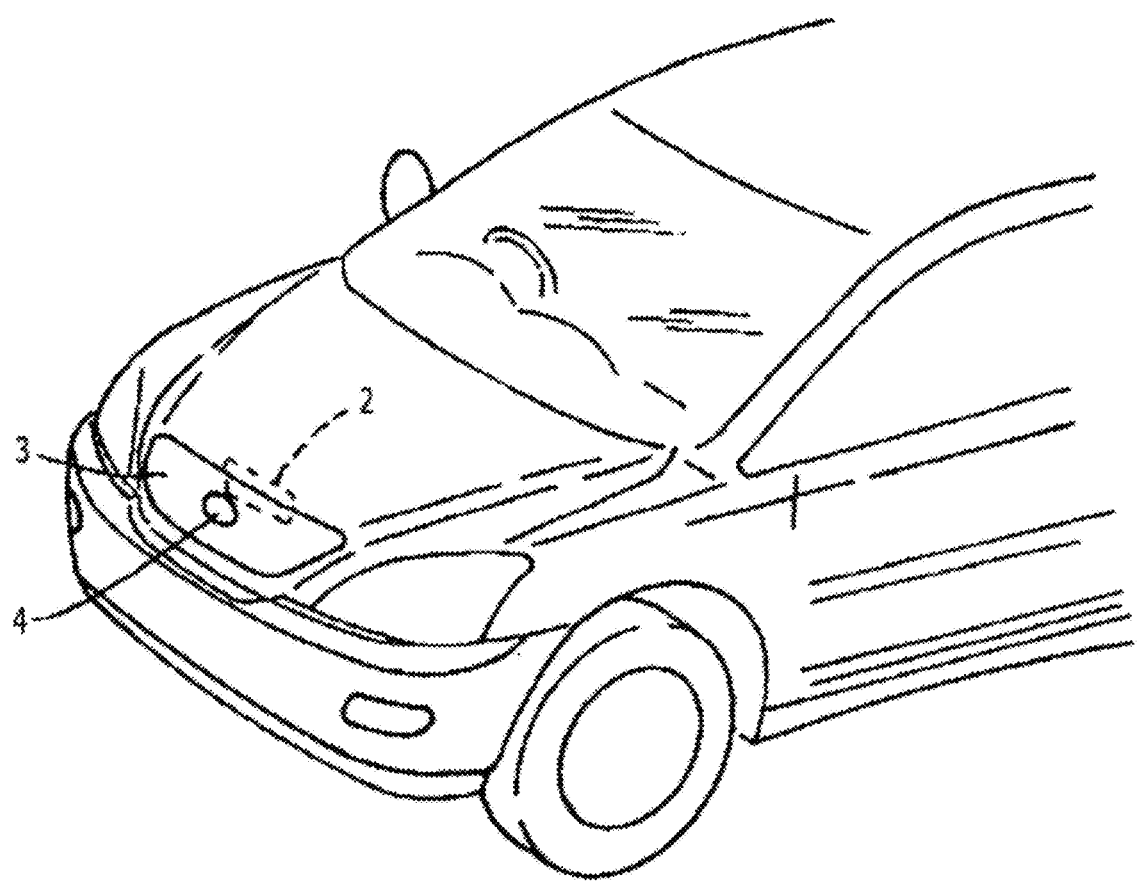
FIG. 1 is an exemplary view showing a vehicle equipped with a smart cruise control sensor.

A preferred embodiment of the present invention provides a manufacturing method of radio wave transmittable sensor cover comprising: (a) preparing a substrate made of a transparent material; (b) forming a primer coating layer to be located on the upper surface of the substrate by a method of coating, dipping or spraying a mixture containing a polymer resin; (c) forming a metal layer having an island structure to be located on the upper surface of the primer coating layer by a physical vapor deposition or chemical vapor deposition method, wherein the metal layer formed in step (c) is deposited and formed on the primer coating layer at a first temperature, the substrate with the metal layer and the primer coating layer is heat-treated at a second temperature relatively lower than the first temperature after deposition of the metal layer, and as a result, micro cracks are formed on the metal layer by a difference in thermal stress between the substrate and the metal layer, and a hole pattern including a plurality of holes which are vertically penetrated by laser punching is formed to correspond to a thickness of the metal layer with the micro cracks to remove bindings between the columnar crystals of the metal layer, and the plurality of holes forming the hole pattern by the laser punching are regularly arranged so as to have predetermined hole diameters and spaces between holes, to have a propagation attenuation rate that is relatively larger than −1.8 dB in an radio wave wavelength region of 76 to 77 GHz and high radio wave transmissivity.

[Embodiments]

Hereinafter, exemplary embodiments of the present invention will be described in detail so as to be easily implemented by those skilled in the art, with reference to the accompanying drawings. As those skilled in the art would realize, the described embodiments may be modified in various different ways, all without departing from the spirit or scope of the present invention.

In addition, a part which is not related with the description is omitted in the drawings in order to clearly describe the present disclosure. In addition, throughout the present specification, similar reference numerals refer to similar elements.

Terms used in the present specification are used to describe specific embodiments, and are not intended to limit the present disclosure. When it is expressed that a first component is "connected (accessed, contacted, and coupled)" to a second component, this means that the first component may be "directly connected" or "indirectly connected" to the second component with a third component therebetween. A singular form may include a plural form if there is no clearly opposite meaning in the context. Further, it should be understood that term "include" or "have"indicates that a feature, a number, a step, an operation, a component, a part or the combination thereof described in the specification is present, but does not exclude a possibility of presence or addition of one or more other features, numbers, steps, operations, components, parts or combinations thereof, in advance.

Figure 2A:
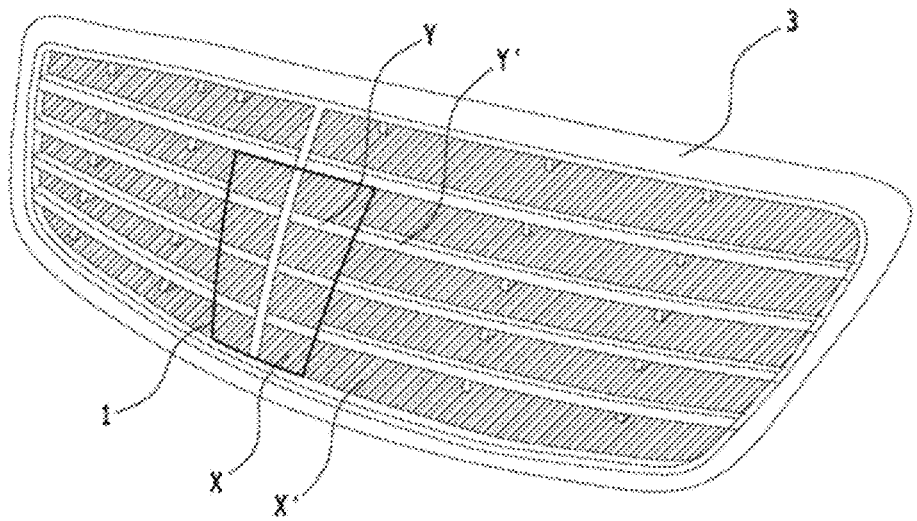
FIGS. 2(a) and 2(b) are exemplary views showing a state in which a sensor cover is installed.
Figure 2B:
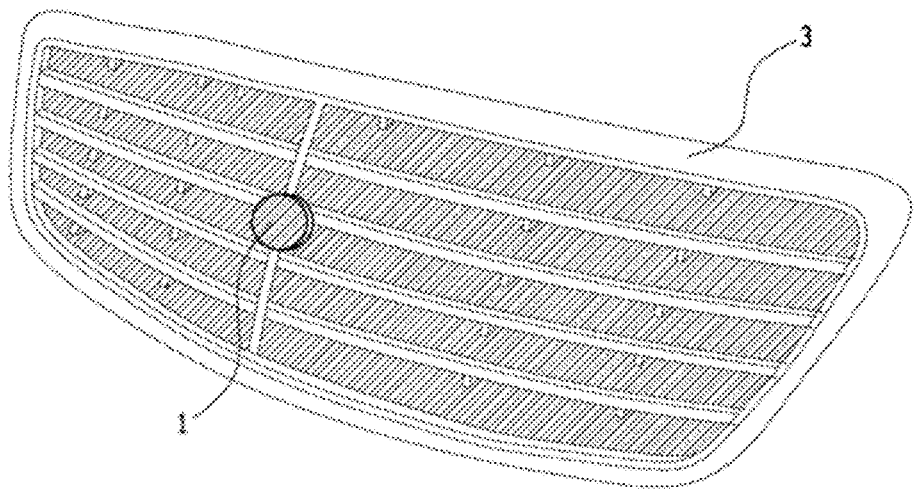
Figure 3:
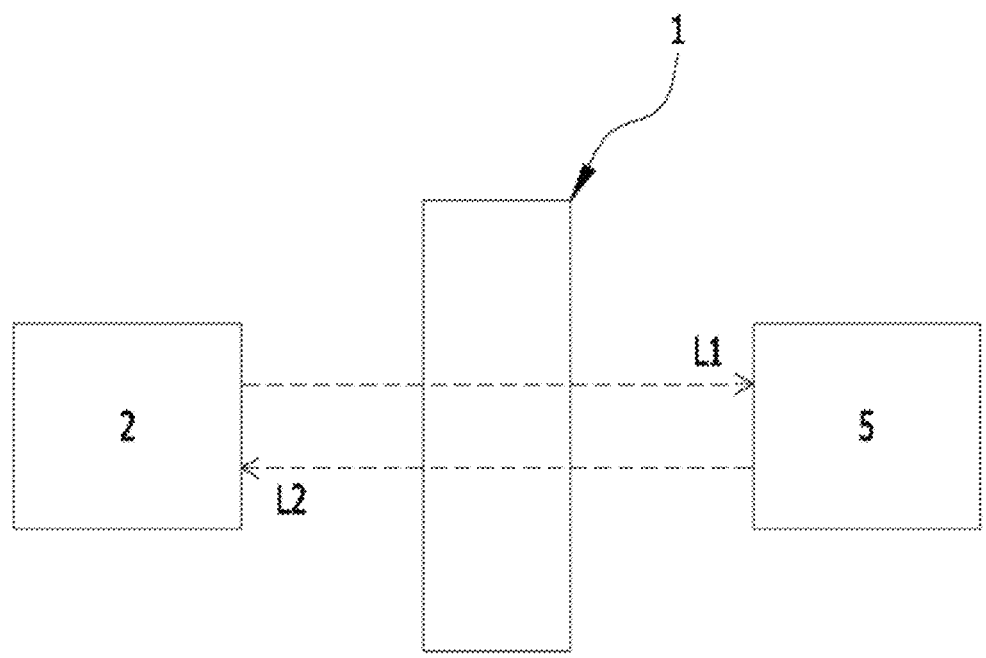
FIG. 3 is a schematic view showing a state in which radio waves transmitted and received by an antenna of a sensor passes through a sensor cover.
Figure 4:
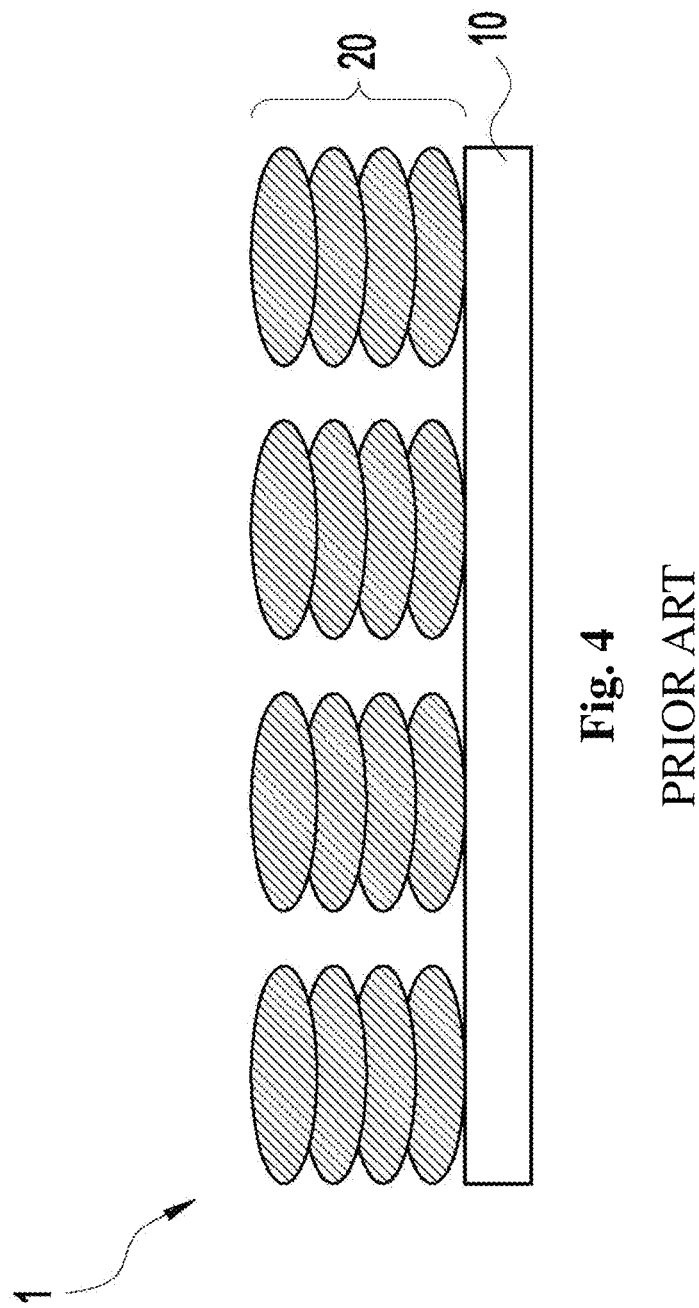
FIG. 4 is an exemplary view showing an island structure of a conventional sensor cover.
Figure 5A:
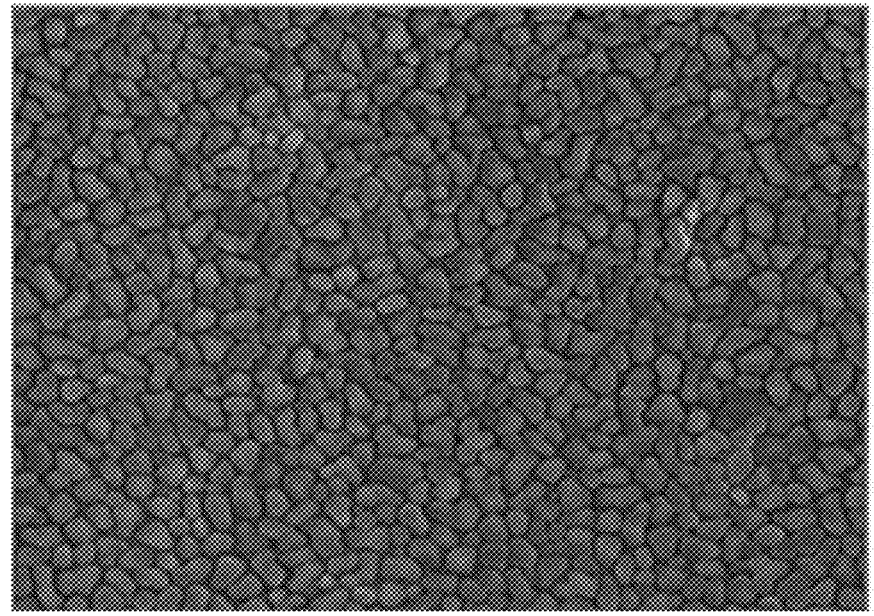
FIGS. 5(a) and 5(a) are SEM images showing examples of the surface of the conventional sensor cover.
Figure 5B:
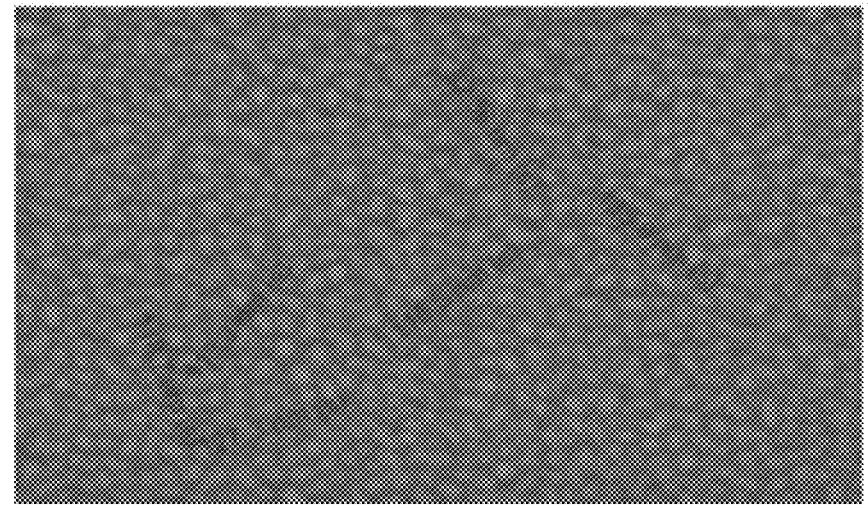
Figure 7:
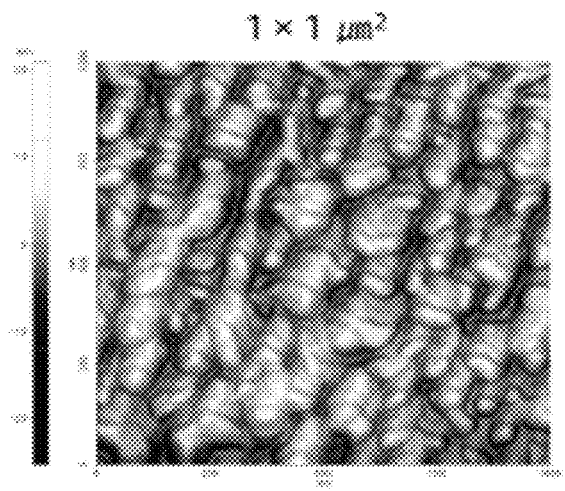
FIGS. 7(a1), 7(a2), 7(b1) and 7 (b2) are AFM images showing examples of the surface of the conventional sensor cover.
Figure 7:
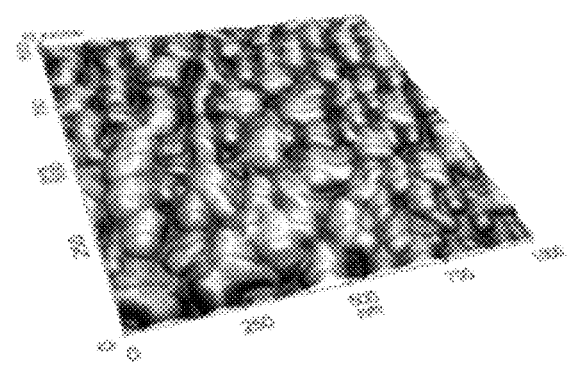
Figure 7:
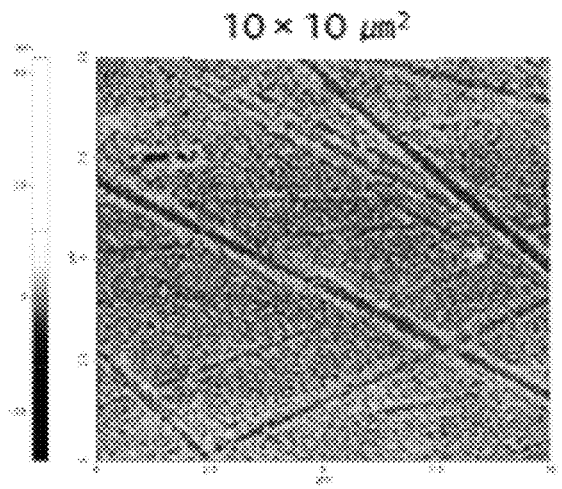
Figure 7:
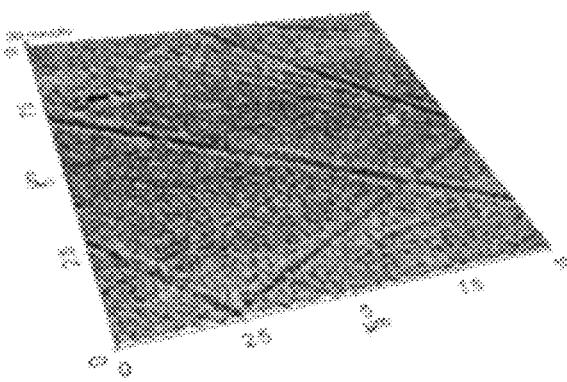

In this specification, a radio wave transmittable laminate 1 itself may be the sensor cover 1 shown in FIGS. 2(a) and 2(b).

In the present specification, the color, brightness, gloss, etc. of the radio wave transmittable laminate 1 refers to the color, brightness, gloss, etc. that are shown when the radio wave transmittable laminate 1 is viewed from a front vehicle 5 side (see FIGS. 3, 8, 11, and 12).

In the present specification, each layer constituting the radio wave transmittable laminate is in the form of a thin film.

EXAMPLES

Example 1: Metal Layer with Micro Cracks

Figure 8:
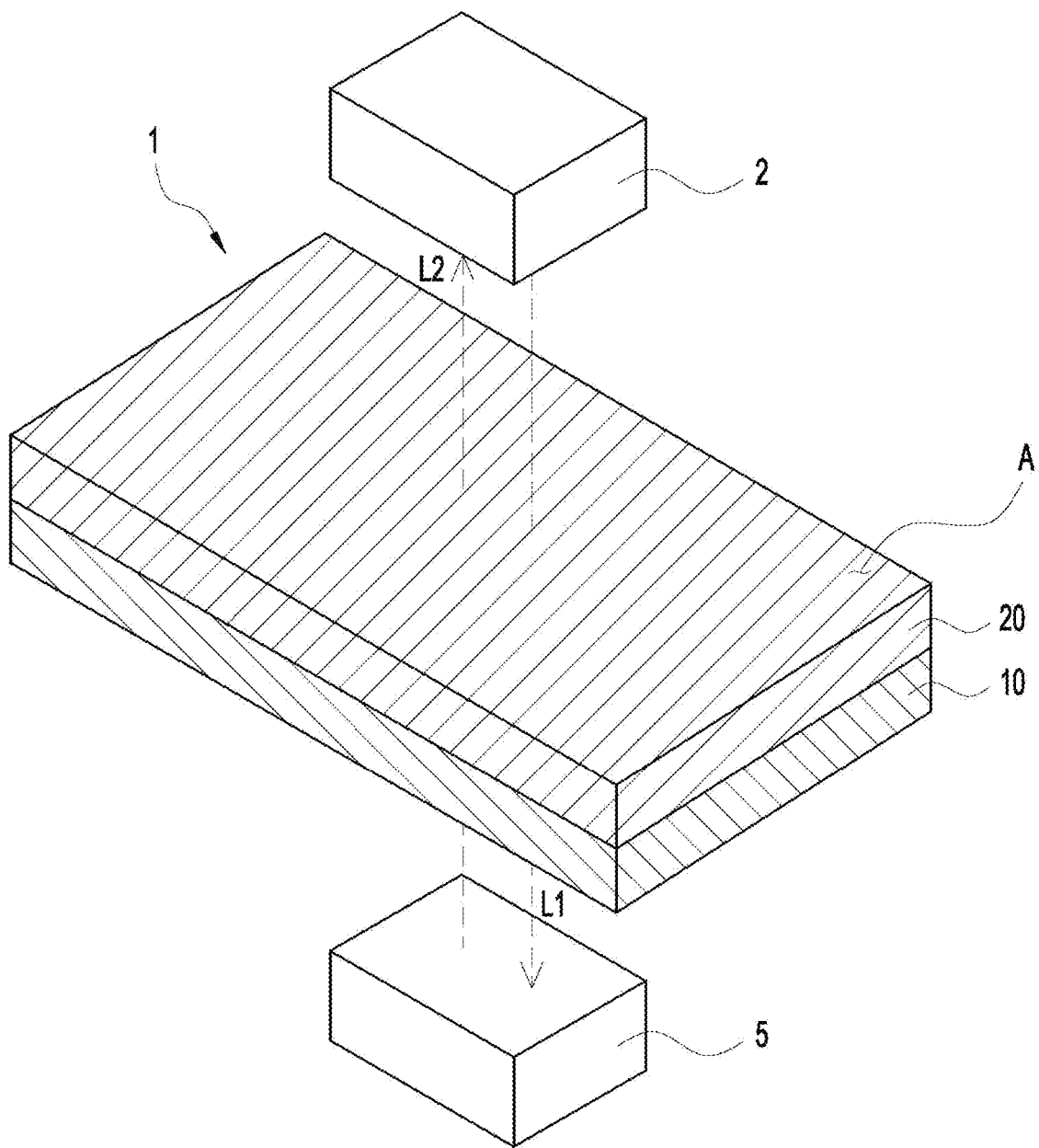
FIG. 8 is a perspective view showing a radio wave transmittable laminate according to an exemplary embodiment of the present invention.
Figure 9:
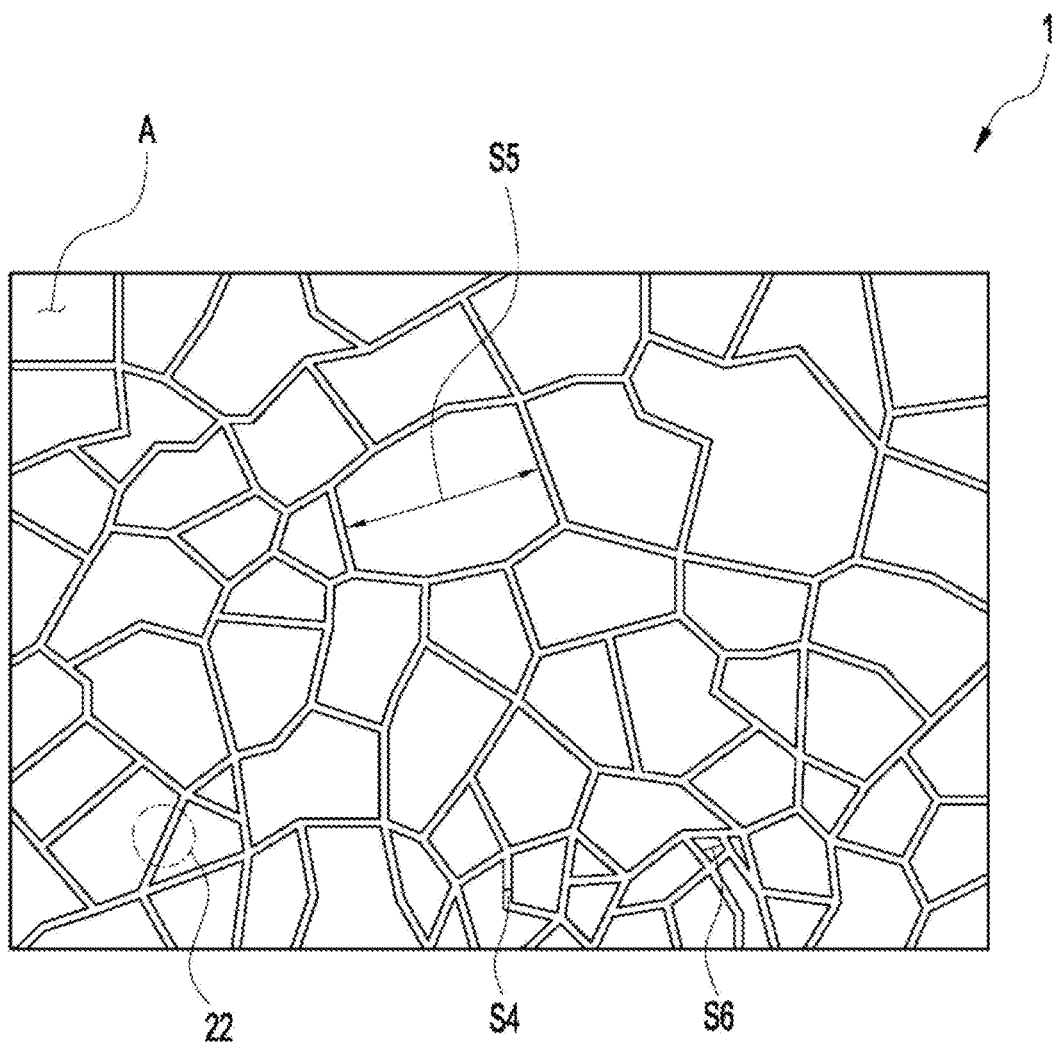
FIG. 9 is a plan view showing the radio wave transmittable laminate according to the exemplary embodiment of the present invention.

FIG. 8 is a perspective view showing a radio wave transmittable laminate according to an exemplary embodiment of the present invention. FIG. 9 is a plan view showing the radio wave transmittable laminate according to the exemplary embodiment of the present invention. An upper surface A of a radio wave transmittable laminate 1 of FIG. 8 is shown in FIG. 9. In addition, to help the understanding, in FIG. 8, in addition to the radio wave transmittable laminate 1, a sensor 2, a front vehicle 5, and radio waves L1 and L2 which penetrate the radio wave transmittable laminate 1 while passing between the sensor 2 and the front vehicle 5 are also shown. Referring to FIGS. 8 and 9, the radio wave transmittable laminate 1 according to the exemplary embodiment of the present invention includes a substrate 10, a metal layer 20, and a plurality of micro cracks 22.

The substrate 10 is a transparent substrate. The transparent substrate may be polycarbonate (PC), polymethylmethacrylate (PMMA), polyethylene terephthalate (PET), polyethylene naphthalate (PEN), polyimide (PI), cycloolefin polymer (COP), polyether sulfone (PES), polyetheretherketone (PEEK), polyarylate (PAR), an ABS resin, or a silicone resin, but the present invention is not limited thereto.

The metal layer 20 is located on the substrate 10 and is made of metal. The metal may be deposited by physical vapor deposition (electron beam deposition, thermal deposition, sputtering, etc.) or chemical vapor deposition to form the metal layer 20.

The plurality of micro cracks 22 are formed in the metal layer 20 as a whole. The radio wave L1 transmitted from an antenna of the sensor 2 that senses the front vehicle 5 penetrates the plurality of micro cracks 22. The radio wave L2 reflected from the front vehicle 5 also penetrates the plurality of micro cracks 22. Accordingly, the metal constituting the metal layer 20 need not be limited to conventional indium, tin, or gallium. Even a metal having high conductivity may be a metal constituting the metal layer 20. Accordingly, there is no limitation on the metal that can be a material of the metal layer 20.

The radio wave transmissivity of the radio wave transmittable laminate 1 may be described by an island structure. The metal layer 20 on which the plurality of micro cracks 22 are formed has an artificially formed island structure. FIG. 10 is a schematic view showing a process of forming an island structure of the radio wave transmittable laminate according to the exemplary embodiment of the present invention.

Figure 10A:
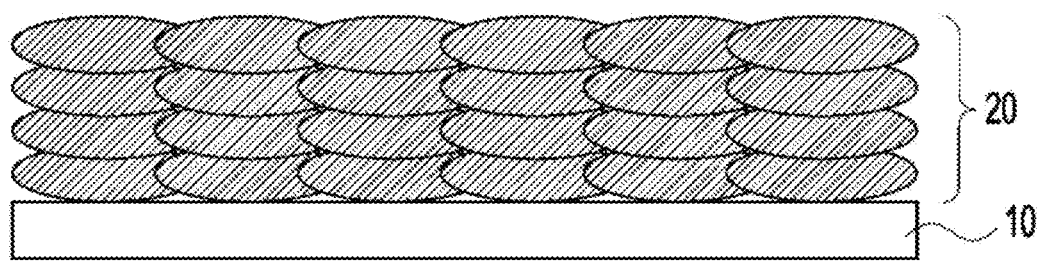
FIGS. 10(a) and 10(b) are schematic views showing a process of forming an island structure of the radio wave transmittable laminate according to the exemplary embodiment of the present invention.

Referring to FIG. 10(a), first, a metal is deposited to form the metal layer 20. At the beginning of metal deposition, nuclei are formed and the nuclei are grown into the island structure. However, in the process of depositing the metal, the islands are combined to form a single land form. That is, the island structure disappears. In this process, the deposited metal is grown to a columnar crystal in a vertical direction of the substrate 10. Adjacent columnar crystals are bound to each other to form a columnar structure. The metal layer 20 of FIG. 10(a) has the columnar structure.

Figure 10B:
Figure 10B:
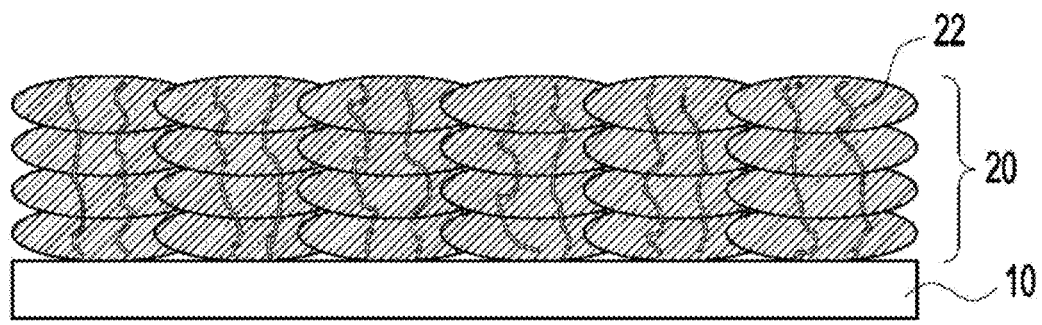

Referring to FIG. 10(b), next, the plurality of micro cracks 22 are artificially formed on the metal layer 20. This is caused by the temperature difference between the metal layer 20 and the substrate 10, which will be described below. Actually, processes of FIGS. 10(a) and 10(b) may be simultaneously performed. The binding of the columnar crystals constituting the metal layer 20 is broken by the plurality of micro cracks 22 formed. Thus, the island structure of FIG. 10(b) is implemented. Since the metal layer 20 having the plurality of micro cracks 22 has the island structure, the metal layer 20 is not conductive and may transmit the radio waves (see [Background Art of the Invention]). The fact that the metal layer 20 with the plurality of micro cracks 22 is not low in conductivity but has no conductivity is confirmed by experiments of the present inventors.

Since the metal layer is made of metal, the metal layer shows gloss and metallic texture. In addition, a designer may select a metal having excellent reliability such as oxidation resistance, water resistance, light resistance, strength and the like as the metal layer material. Thus, the radio wave transmittable laminate exhibiting gloss and having radio wave transmissivity and reliability may be prepared.

Referring back to FIG. 9, a line width S4 of the micro crack 22 is preferably 0.1 to 80 μm. If the line width S4 of the micro crack 22 is less than 0.1 μm, the micro crack 22 is too fine and a propagation attenuation rate of the radio wave transmittable laminate 1 may be lower than a reference value (−1.8 dB at 76 to 77 GHz). In other words, the radio wave transmissivity of the metal layer 20 may be deteriorated. On the other hand, if the line width S4 of the micro crack 22 exceeds 80 μm, the strength of the metal layer 20 may be lowered, or the gloss and the metal texture may be deteriorated.

Even if the line width S4 of the micro crack 22 is 0.1 to 80 μm, if spaces (S5, S6, etc.) between the micro cracks 22 are too large, the radio wave transmissivity of the entire metal layer 20 will be poor. Preferably, the space (S5, S6, etc.) between the micro cracks 22 facing each other in the plurality of micro cracks 22 is 5 to 1000 μm. If the space (S5, S6, etc.) between the micro cracks 22 exceeds 1000 μm, a propagation attenuation rate of the radio wave transmittable laminate 1 may be lower than the reference value (−1.8 dB at 76 to 77 GHz). On the other hand, if the space (S5, S6, etc.) between the micro cracks 22 is less than 5 μm, the gloss and the metal texture of the metal layer 20 may be deteriorated.

Figure 11:
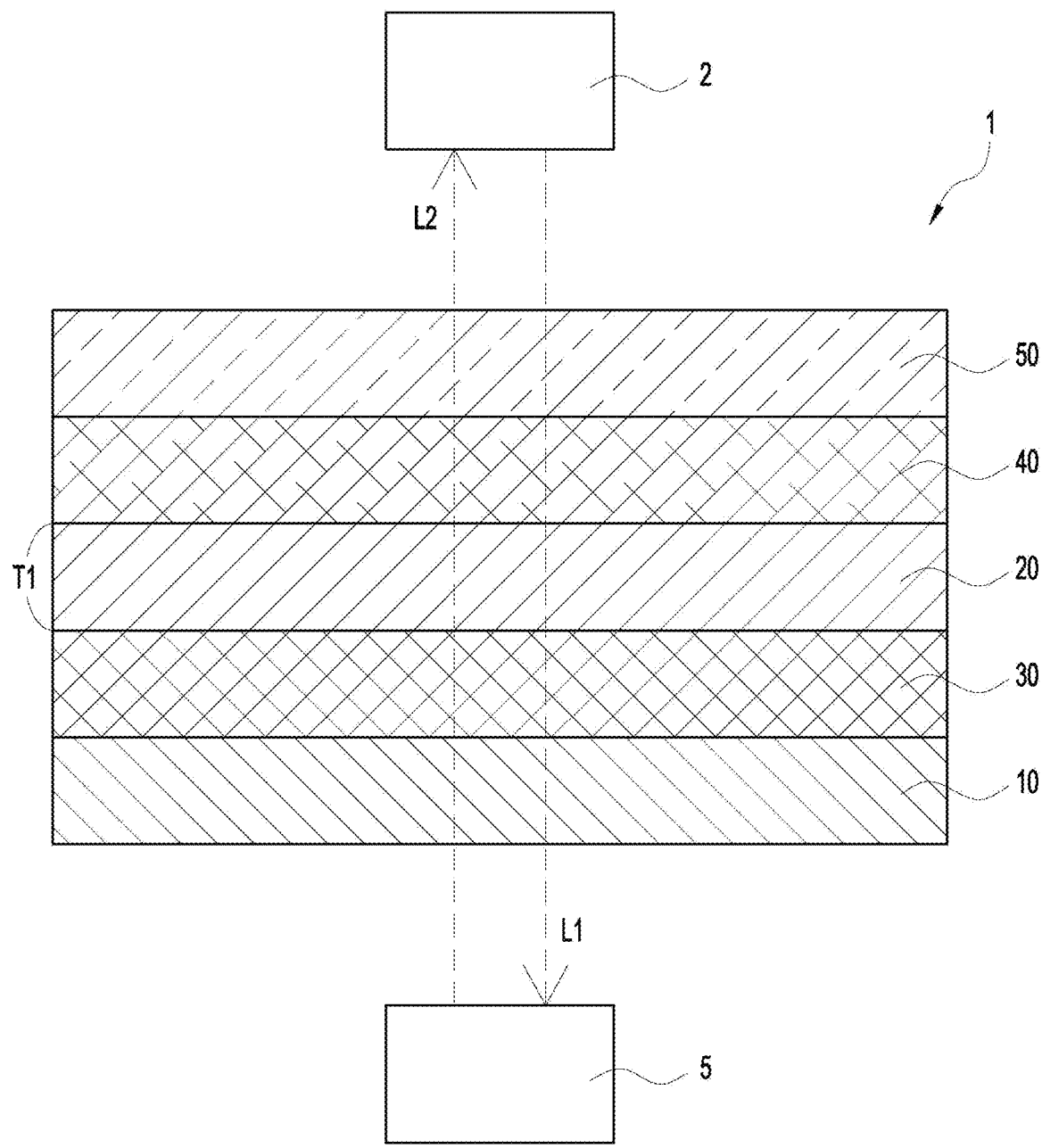
FIG. 11 is a side view showing the radio wave transmittable laminate according to the exemplary embodiment of the present invention.

The radio wave transmittable laminate 1 may further include a primer coating layer 30, a chromium oxide layer 40, and/or a black shield coating layer 50. FIG. 11 is a side view showing the radio wave transmittable laminate 1 according to the exemplary embodiment of the present invention. In addition, to help the understanding, in FIG. 11, in addition to the radio wave transmittable laminate 1, the sensor 2, the front vehicle 5, and the radio waves L1 and L2 which penetrate the radio wave transmittable laminate 1 while passing between the sensor 2 and the front vehicle 5 are also shown.

Referring to FIG. 11, the primer coating layer 30 is located on the upper surface of the substrate 10. The metal layer 20 is located on the upper surface of the primer coating layer 30. The chromium oxide layer 40 is located on the upper surface of the metal layer 20. A black shield coating layer 50 is located on the upper surface of the chromium oxide layer 40.

The primer coating layer 30 includes a polymer resin to improve adhesion between the substrate 10 and the metal layer 20. The primer coating layer 30 may be formed by mixing a polymer resin, a solvent, and other additives, and then painting, dipping, or spraying the mixture. The primer coating layer 30 is transparent or translucent.

The chromium oxide layer 40 is made of chromium oxide ($CrO_x$) to prevent the metal layer 20 from being oxidized by contacting moisture. In addition, the chromium oxide layer 40 protects the metal layer 20 from external impact. In addition, the chromium oxide layer 40 improves adhesion between the metal layer 20 and the black shield coating layer 50. The chromium oxide layer 40 may be formed by physical vapor deposition or chemical vapor deposition.

Preferably, the thickness of the chromium oxide layer 40 is 5 to 40 nm. If the thickness of the chromium oxide layer 40 is less than 5 nm, it is difficult for the chromium oxide layer 40 to protect the metal layer 20 from moisture or external impact. If the thickness of the chromium oxide layer 40 exceeds 40 nm, the radio wave transmissivity of the radio wave transmittable laminate 1 is deteriorated and the attenuation ratio may be less than −1.8 dB at a frequency of 76 to 77 GHz.

The laminate composed of other layers except for the black shield coating layer 50 may be translucent. In this case, the sensor 2 or internal parts of the vehicle shown in FIG. 11 are shown on the outside, and the appearance of the vehicle may be deteriorated. The black shield coating layer 50 includes a black pigment so as to shield visible light so that the visible light reaching the radio wave transmittable laminate 1 does not penetrate the radio wave transmittable laminate 1. Of course, the black shield coating layer 50 does not shield the radio waves. Even through the laminate without the black shield coating layer 50 does not damage the appearance of the vehicle, the black shield coating layer 50 is added, the black shield coating layer 50 may protect the underlying layers from external impact.

The black shield coating layer 50 may be formed by mixing a polymer resin, a solvent, and other additives, and then painting, dipping, or spraying the mixture.

According to the exemplary embodiment of the present invention, the metal layer 20 and the chromium oxide layer 40 exhibit translucent dark colors, and the black shield coating layer 50 exhibits opaque black. Accordingly, the radio wave transmittable laminate 1 exhibits an opaque dark color and has continuity with a surrounding front grill. On the other hand, the thicker the metal layer 20, the brighter the color.

Preferably, a thickness T1 of the metal layer 20 is 1 to 100 nm. If the thickness of the metal layer 20 is less than 1 nm, the metal layer 20 loses the gloss and the metallic texture. In addition, in the thickness range of 1 to 100 nm, the metal layer 20 may exhibit various colors with sufficient brightness, so that it is inefficient to manufacture a laminate in which the thickness of the metal layer 20 exceeds 100 nm.

The metal layer 20 may be formed by depositing the metal on the substrate 10 on which the primer coating layer 30 is formed by physical vapor deposition or chemical vapor deposition. The micro cracks 22 are formed in this deposition process.

For performing physical vapor deposition or chemical vapor deposition, the substrate 10 on which the primer coating layer 30 is formed and the metal may be located in a vacuum chamber. In addition, an atmospheric temperature in the vacuum chamber may be set to a first temperature (deposition temperature). In this case, a metal is deposited on the substrate 10 on which the primer coating layer 30 is formed at the first temperature. After the metal layer 20 is formed at the first temperature, the substrate 10 on which the metal layer 20 and the primer coating layer 30 are formed is heat-treated at a second temperature (heat treatment temperature). The second temperature is lower than the first temperature. The heat treatment may be performed simply by changing the atmospheric temperature in the vacuum chamber from the first temperature to the second temperature.

By the heat treatment, the temperatures of the metal layer 20 and the substrate 10 falls from the first temperature to the second temperature. The substrate 10 and the metal layer 20 have different thermal expansion coefficients. Accordingly, thermal stress is generated in the metal layer 20 while the temperature of the metal layer 20 falls from the first temperature to the second temperature. Thus, the micro cracks 22 are formed on the metal layer 20.

The metal deposited to form the metal layer 20 may be a hard metal. Here, the hard metal means a metal deposited as a hard thin film when deposited. The metals belonging to groups 4B to 7B on the periodic table correspond to hard metals. Specifically, the hard metal may be titanium (Ti), zirconium (Zr), hafnium (Hf), niobium (Nb), tantalum (Ta), chromium (Cr), molybdenum (Mo), tungsten (W) or manganese (Mn). The hard metal is deposited to form the metal layer 20 with the micro cracks 22 capable of transmitting radio waves while the hardness is high.

A soft metal may also be used as the metal. Here, the soft metal means a metal deposited as a soft thin film when deposited. The metals belonging to groups 3A to 6A on the periodic table correspond to soft metals. Specifically, the soft metal may be aluminum (Al), indium (In), tin (Sn), gallium (Ga), or germanium (Ge). However, the soft metal has a property softer than the hard metal. Therefore, even though the soft metal is deposited on the substrate having the primer coating layer at the first temperature to form the metal layer, and the substrate on which the metal layer and the primer coating layer are formed is heat-treated at the second temperature, the micro cracks may not be formed on the metal layer made of the soft metal. Accordingly, in the case of depositing the soft metal, it is preferable to form a crack inducing layer on the upper surface of the primer coating layer before deposition. An exemplary embodiment therefor is shown in FIG. 12.

Figure 12:
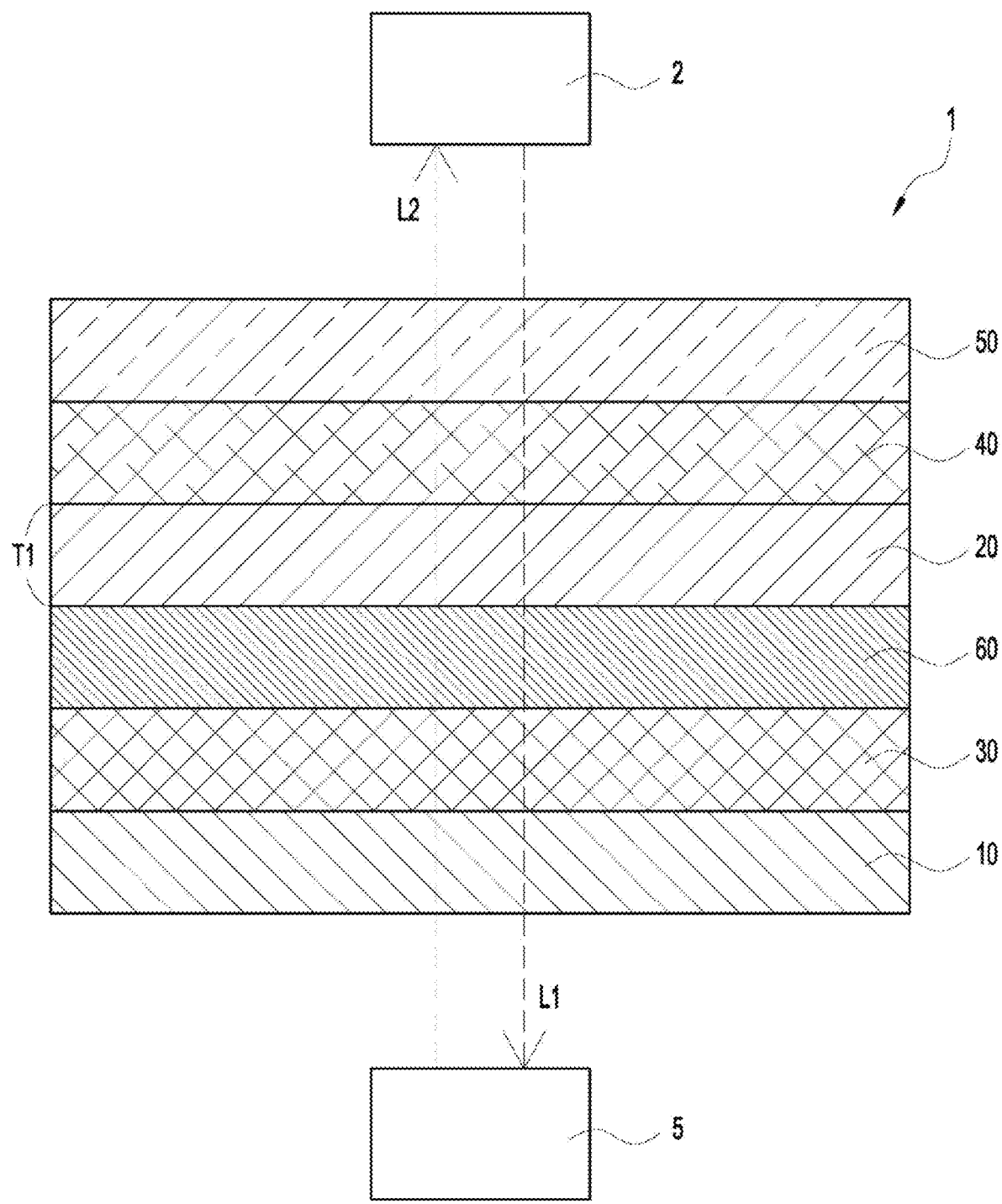
FIG. 12 is a side view showing the radio wave transmittable laminate according to the exemplary embodiment of the present invention.

FIG. 12 is a side view showing the radio wave transmittable laminate according to the exemplary embodiment of the present invention. In FIG. 12, the crack inducing layer 60 is added to the laminate of FIG. 1. The crack inducing layer 60 located on the upper surface of the primer coating layer 30 is composed of zinc sulfide (ZnS) or zinc selenide (ZnSe). In a thin film composed of zinc sulfide or zinc selenide, the cracks occur well. In the process of forming the metal layer on the upper surface of the crack inducing layer 60 with the cracks, the crack inducing layer 60 induces the formation of micro cracks on the metal layer 20.

In this case, the metal layer 20 is not in direct contact with the substrate 10 on which the primer coating layer 30 is formed, and the crack inducing layer 60 induces the formation of micro cracks on the metal layer 20. A difference in thermal expansion coefficient between the metal layer 20 and the crack inducing layer 60 is larger than the difference in thermal expansion coefficient between the metal layer 20 and the substrate 10. Accordingly, even if the metal layer 20 is formed of a soft metal, the micro cracks may be formed on the metal layer 20.

Preferably, the thickness of the crack inducing layer 60 is 5 to 30 nm. If the thickness of the crack inducing layer 60 is less than 5 nm, the crack inducing layer 60 is too thin and thus, it is not easy to induce the formation of micro cracks on the metal layer 20. On the other hand, if the thickness of the crack inducing layer 60 exceeds 30 nm, micro cracks having an excessively wide line width may be formed in the metal layer 20, and thus, the gloss and metal texture of the metal layer 20 may be deteriorated. In this case, the adhesion of the metal layer 20 may also be deteriorated.

The exemplary embodiment shown in FIG. 12 will be described in more detail. For convenience of explanation, a crack formed in the crack inducing layer 60 are referred to as first micro cracks, and a micro crack formed in the metal layer 20 are referred to as a second micro crack.

First, the substrate 10 on which the primer coating layer 30 is formed and zinc sulfide or zinc selenide are located in the vacuum chamber. In addition, an atmospheric temperature in the vacuum chamber is set to a first temperature.

Next, at the first temperature, zinc sulfide or zinc selenide is deposited on the substrate 10 on which the primer coating layer 30 is formed by physical vapor deposition or chemical vapor deposition to form the crack inducing layer 60.

Next, the substrate 10 on which the crack inducing layer 60 and the primer coating layer 30 are formed is heat-treated at a second temperature lower than the first temperature. As described above, the heat treatment may be performed simply by changing the atmospheric temperature in the vacuum chamber from the first temperature to the second temperature. The substrate 10 and the crack inducing layer 60 have different thermal expansion coefficients. Accordingly, thermal stress is generated in the crack inducing layer 60 while the temperature of the crack inducing layer 60 falls from the first temperature to the second temperature. Accordingly, a plurality of first micro cracks is formed in the crack inducing layer 60 as a whole.

Next, the soft metal is charged into the vacuum chamber and the atmospheric temperature in the vacuum chamber is set to the first temperature. The soft metal is deposited on the upper surface of the crack inducing layer 60 at the first temperature by physical vapor deposition or chemical vapor deposition to form the metal layer 20.

Next, the substrate 10 on which the metal layer 20, the crack inducing layer 60, and the primer coating layer 30 are formed is heat-treated at the second temperature. Thus, the temperature of the metal layer 20 falls from the first temperature to the second temperature. In this process, the plurality of second micro cracks is formed in the metal layer 20 as a whole.

With respect to the first temperature and second temperature described above, a difference between the first temperature and the second temperature is preferably 10° C. or higher. Under such a temperature difference condition, the micro cracks may be easily formed.

Example 2: Metal Layer with Hole Pattern

Figure 13:
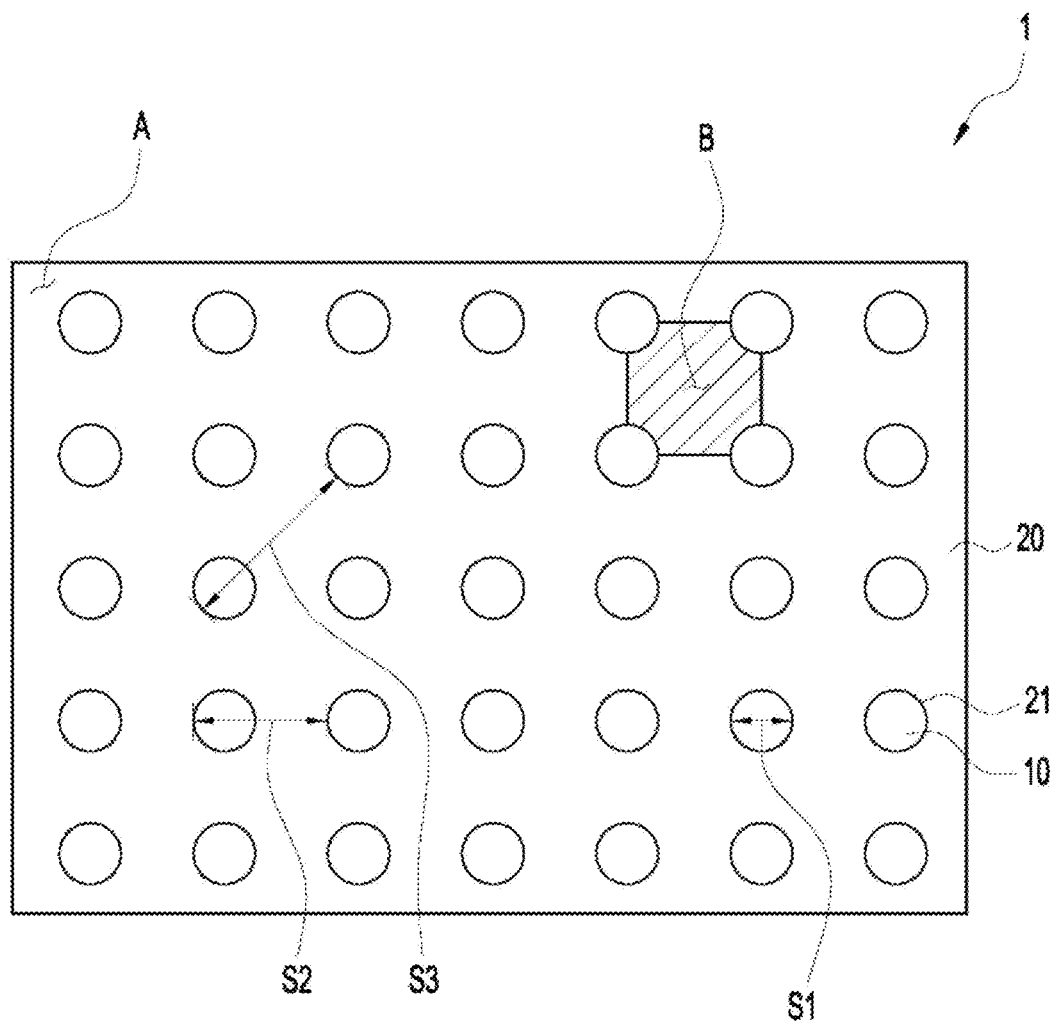
FIG. 13 is a plan view showing the radio wave transmittable laminate according to the exemplary embodiment of the present invention.

FIG. 8 is a perspective view showing a radio wave transmittable laminate according to an exemplary embodiment of the present invention. FIG. 13 is a plan view showing the radio wave transmittable laminate according to the exemplary embodiment of the present invention. An upper surface A of the radio wave transmittable laminate 1 of FIG. 8 is shown in FIG. 13. Referring to FIGS. 8 and 13, the radio wave transmittable laminate 1 according to the exemplary embodiment of the present invention includes the substrate 10, the metal layer 20, and a hole pattern. The radio wave transmittable laminate 1 may further include the primer coating layer 30, the chromium oxide layer 40, and/or the black shield coating layer 50 (see FIG. 11). The content of the substrate 10, the color, gloss and thickness of the metal layer 20, the primer coating layer 30, the chromium oxide layer 40, the black shield coating layer 50, and the like have been described in Example 1. Hereinafter, referring to FIGS. 8 and 13, the radio wave transmittable laminate 1 will be described based on a hole pattern which is not described in Example 1.

The metal layer 20 is located on the substrate 10 and is made of metal. The metal layer 20 may be formed by physical vapor deposition or chemical vapor deposition.

The hole pattern is composed of a plurality of holes 21. The plurality of holes 21 vertically penetrates the metal layer 20. In addition, the plurality of holes 21 may be punched by a laser. The plurality of holes 21 penetrate only the metal layer 20 and do not penetrate other layers as follows. This is because, in general, the layer which is difficult to transmit the radio waves corresponds to the metal layer 20 and other layers are not so difficult to transmit the radio waves. An radio wave L1 transmitted from an antenna of the sensor 2 that senses the front vehicle 5 penetrates the plurality of holes 21. An radio wave L2 reflected from the front vehicle 5 also penetrates the plurality of holes 21. Accordingly, the metal constituting the metal layer 20 need not be limited to conventional indium, tin, or gallium. Even a metal having high conductivity may be a metal constituting the metal layer 20. Accordingly, there is no limitation on the metal that can be a material of the metal layer 20.

The radio wave transmissivity of the radio wave transmittable laminate 1 may be described by an island structure. The metal layer 20 with the hole pattern has an artificially formed island structure. FIG. 14 is a schematic view showing a process of forming an island structure of the radio wave transmittable laminate according to the exemplary embodiment of the present invention.

Figure 14A:
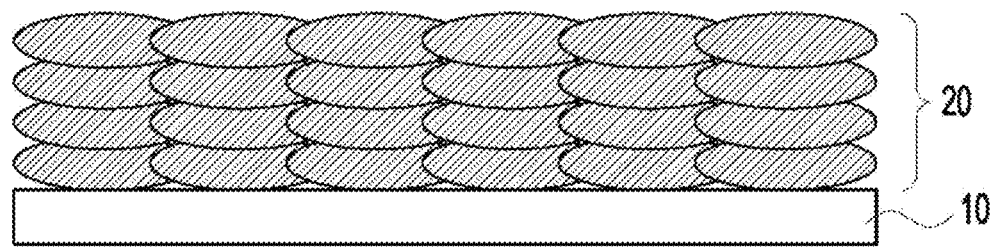
FIGS. 14(a) and 14(b) are schematic views showing a process of forming an island structure of the radio wave transmittable laminate according to the exemplary embodiment of the present invention.

Referring to FIG. 14(a), first, a metal is deposited to form the metal layer 20. At the beginning of metal deposition, nuclei are formed and the nuclei are grown into the island structure. However, in the process of depositing the metal, the islands are combined to form a single land form. That is, the island structure disappears. In this process, the deposited metal is grown to a columnar crystal in a vertical direction of the substrate 10. Adjacent columnar crystals are bound to each other to become a columnar structure. The metal layer 20 of FIG. 14(a) has the columnar structure.

Figure 14B:
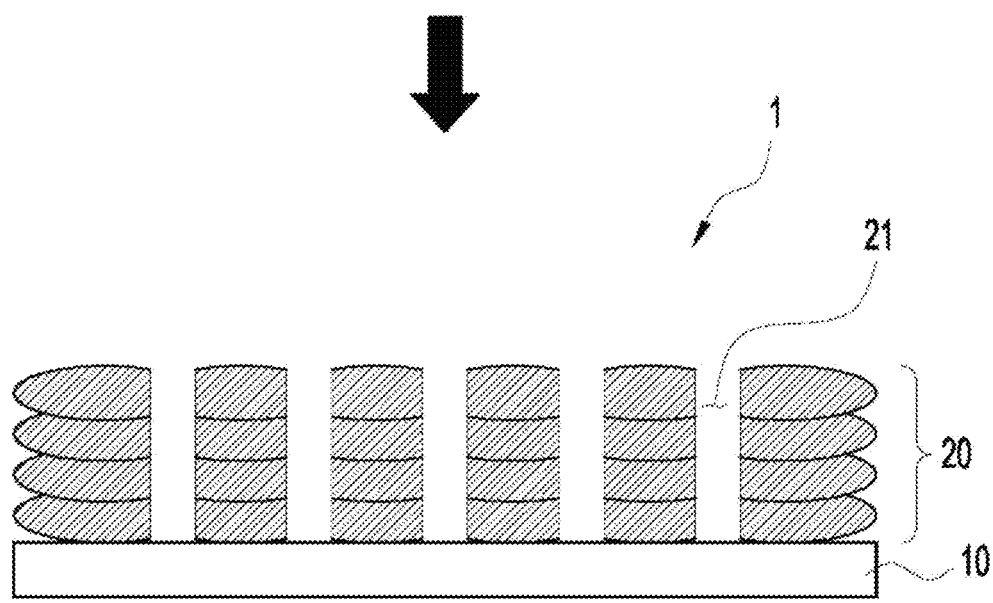

Referring to FIG. 14(b), next, the hole pattern is formed on the metal layer 20 artificially (by laser punching). The binding between the columnar crystals forming the metal layer 20 is broken by the formed hole pattern. Thus, the island structure of FIG. 14(b) is implemented. Since the metal layer 20 having the hole pattern has the island structure, the metal layer 20 is not conductive and may transmits the radio waves (see [Background Art of the Invention]).

As can be seen from the term "pattern" of the hole pattern, the plurality of holes 21 transmitting the radio waves are regularly arranged. As shown in FIG. 13, the plurality of holes 21 are arranged so as to be spaced apart from each other at regular intervals in a horizontal direction when the radio wave transmittable laminate 1 is viewed from the top, or may be arranged so as to be spaced apart from each other at regular intervals in a vertical direction. In this case, four adjacent holes form a square cross section B.

The plurality of holes 21 are not randomly punctured but have predetermined hole diameters and space between the holes. In FIG. 13, for convenience of explanation, a hole diameter S1 and space between the holes S2 and S3 are exaggerated. In FIG. 13, the substrate 10 below metal layer 20 looks like through the hole 21, but actually, the hole 21 is very fine, so that the bottom of the metal layer 20 is not visually recognized.

Referring to FIG. 13, preferably, the hole diameter S1 is 1 to 200 μm. If the hole diameter S1 is less than 1 μm, the hole 21 is too fine and the propagation attenuation rate of the radio wave transmittable laminate 1 may be lower than a reference value (−1.8 dB at 76 to 77 GHz). In other words, the radio wave transmissivity of the metal layer 20 may be deteriorated. On the other hand, if the hole diameter S1 exceeds 200 μm, the hole 21 may be visually recognized and the inside of the vehicle may be seen through the hole 21, so that the continuity of the surroundings with the radio wave transmittable laminate 1 may be damaged.

Even if the hole diameter S1 is 1 to 200 μm, if the space between the holes S2 and S3 are too long, the radio wave transmissivity of the entire metal layer 20 will be poor. Preferably, the spaces S2 and S3 between the plurality of holes 21 are 5 to 1000 μm. Referring to FIG. 13, the spaces between the plurality of holes 21 may include a minimum space S2 and a maximum space S3, and both spaces are preferably within the above range. If the space between the holes S2 and S3 exceeds 1000 μm, a propagation attenuation rate of the radio wave transmittable laminate 1 may be lower than the reference value (−1.8 dB at 76 to 77 GHz). On the other hand, if the space between the holes S2 and S3 are less than 5 μm, the radio wave transmissivity may be improved, but the plurality of holes 21 can be arranged in a very compact manner. In this case, the gloss and the metal texture of the radio wave transmittable laminate 1 may be damaged.

Example 3: Metal Layer with Micro Cracks and Hole Pattern

A radio wave transmittable laminate of Example 3 is a laminate including a metal layer in which the micro cracks of Example 1 and the hole pattern of Example 2 are both formed.

Figure 15:
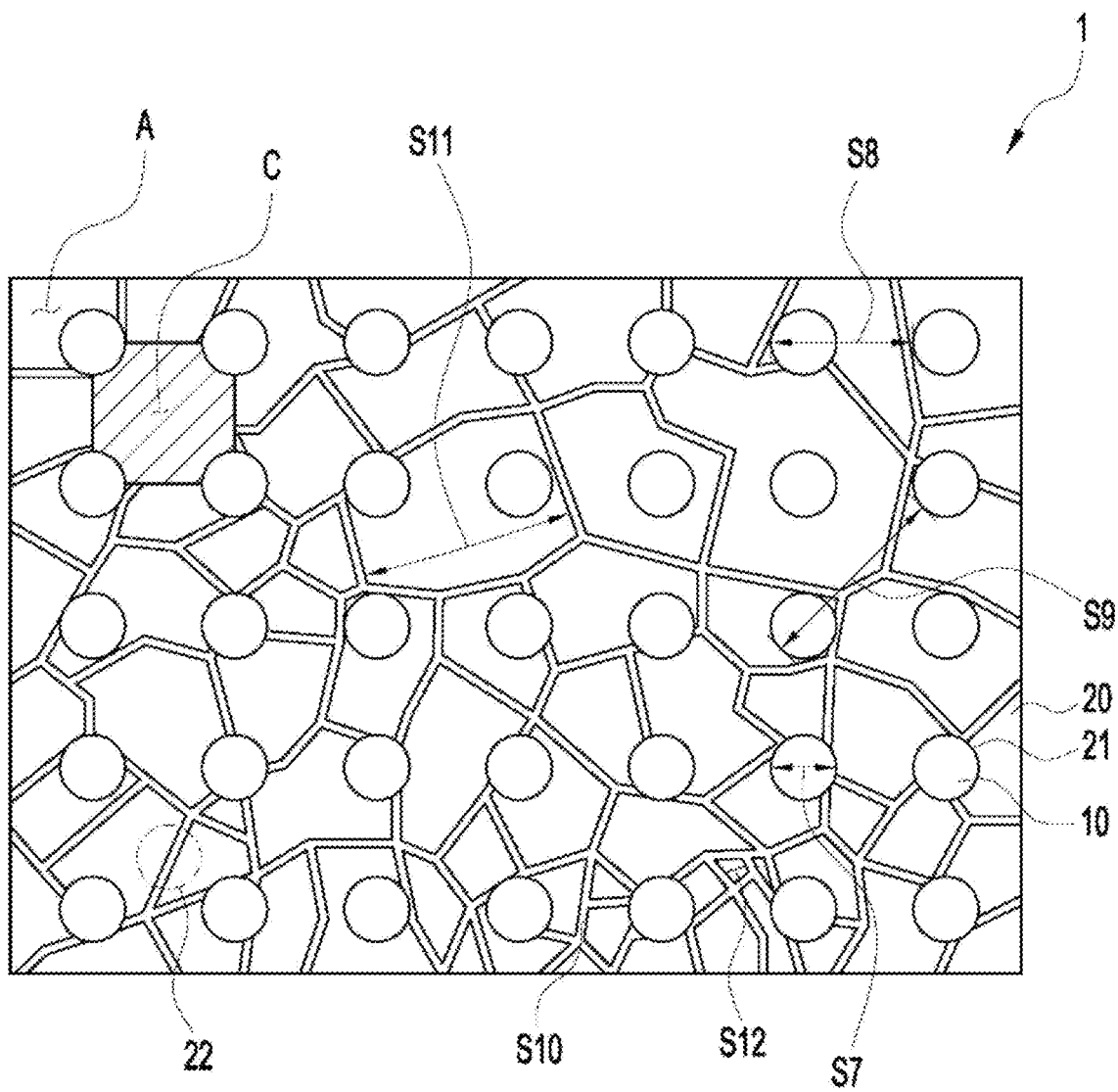
FIG. 15 is a plan view showing the radio wave transmittable laminate according to the exemplary embodiment of the present invention.

FIG. 8 is a perspective view showing a radio wave transmittable laminate according to an exemplary embodiment of the present invention. FIG. 15 is a plan view showing the radio wave transmittable laminate according to the exemplary embodiment of the present invention. An upper surface A of the radio wave transmittable laminate 1 of FIG. 8 is shown in FIG. 15. Referring to FIGS. 8 and 15, the radio wave transmittable laminate 1 according to the exemplary embodiment of the present invention includes the substrate 10, the metal layer 20, the plurality of micro cracks 22, and the hole pattern constituted by the plurality of holes 21. The radio wave transmittable laminate 1 may further include the primer coating layer 30, the chromium oxide layer 40, and/or the black shield coating layer 50 (see FIG. 11).

The contents for the substrate 10, the material, color, gloss, thickness, and forming method of the metal layer 20, the primer coating layer 30, the chromium oxide layer 40, the black shield coating layer 50, the formation method of the micro cracks 22, the line width S1 of the micro cracks 22, the spaces S11, S12, etc. between the micro cracks facing each other among the plurality of micro cracks 22, the formation method of the hole pattern, four holes forming a square cross section C, the hole diameter S7, and the space between the holes S8 and S9, and the like have been described in Examples 1 and 2.

In the metal layer 20, both the plurality of micro cracks 22 and the hole pattern are formed so as to transmit radio waves. The micro cracks 22 and the hole pattern are synergistic in terms of radio wave transmissivity. Accordingly, the radio wave transmittable laminate 1 of Example 3 is excellent in radio wave transmissivity as compared with the radio wave transmittable laminate in Examples 1 and 2.

Figure 16A:
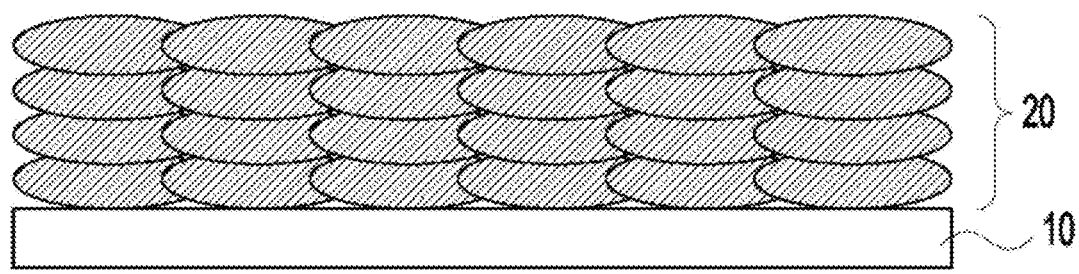
FIGS. 16(a) and 16(b) are schematic views showing a process of forming an island structure of the radio wave transmittable laminate according to the exemplary embodiment of the present invention.

The radio wave transmissivity of the radio wave transmittable laminate 1 in Example 3 may be described by an island structure. The metal layer 20 on which the plurality of micro cracks 22 are formed has an artificially formed island structure. FIG. 16 is a schematic view showing a process of forming an island structure of the radio wave transmittable laminate according to the exemplary embodiment of the present invention. The contents for FIG. 16(a) have been described above together with FIG. 10(a) or FIG. 14(a).

Figure 16B:
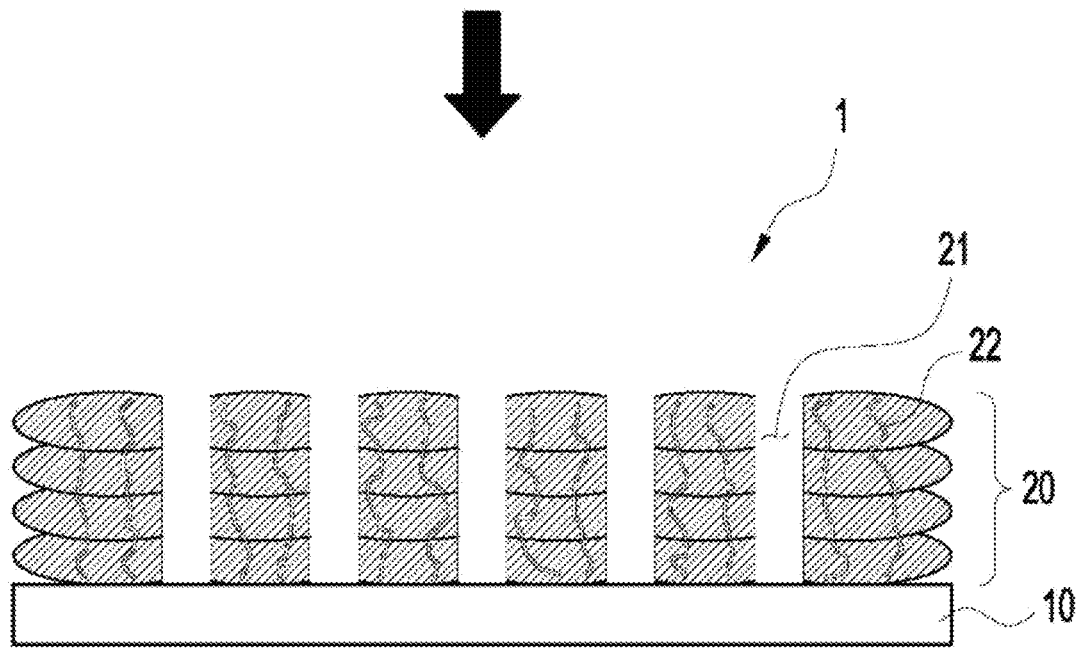

Referring to FIG. 16(b), next, the plurality of micro cracks 22 and the hole pattern are artificially formed on the metal layer 20. The binding of the columnar crystals constituting the metal layer 20 is broken by the plurality of micro cracks 22 formed. Accordingly, the island structure is implemented. In addition, the binding between the columnar crystals is further broken by the formed hole pattern to secure an additional space between the islands. Accordingly, the island structure is more stably formed. Since the metal layer 20 of FIG. 16(b) has a stable island structure, there is no conductivity and the radio wave transmissivity is excellent.

Preparation Example 1: Preparation of Metal Layers having Different Hole Diameters An upper surface of a polycarbonate substrate was coated with a slurry containing an acrylic resin as a main component, and a primer coating layer was formed on the upper surface of the polycarbonate substrate.

The polycarbonate substrate with the primer coating layer formed on the upper surface was mounted on an upper portion of a vacuum chamber. Aluminum was injected into a crucible provided in the vacuum chamber. The vacuum degree in the vacuum chamber was set to $1\times10^{-5}$ torr. The temperature in the vacuum chamber was set at 70° C. A voltage of 7.5 kV was supplied to an electron gun provided in the vacuum chamber, and an electron beam was irradiated to aluminum. As a result, a metal layer composed of aluminum was formed on the upper surface of the primer coating layer.

Next, a laser was irradiated from the upper portion of the metal layer toward the metal layer to punch a plurality of holes penetrating the metal layer. That is, a hole pattern was formed. The arrangement of the plurality of holes constituting the hole pattern is as shown in FIG. 13. In Preparation Example 1, a plurality of samples were prepared by changing only the hole diameter S1 while keeping the space S2 between holes the same (see FIG. 13).

Next, a chromium oxide layer composed of $Cr_2O_3$ was formed on the upper surface of the metal layer in the same manner as the deposition method (electron beam evaporation) of the metal layer. The thickness of the chromium oxide layer was 15 nm.

Next, the polycarbonate substrate with the chromium oxide layer formed thereon was coated with a slurry containing an acrylic resin as a main component and adding a black pigment, and a black shield coating layer was formed on the upper surface of the chromium oxide layer.

Figure 17:
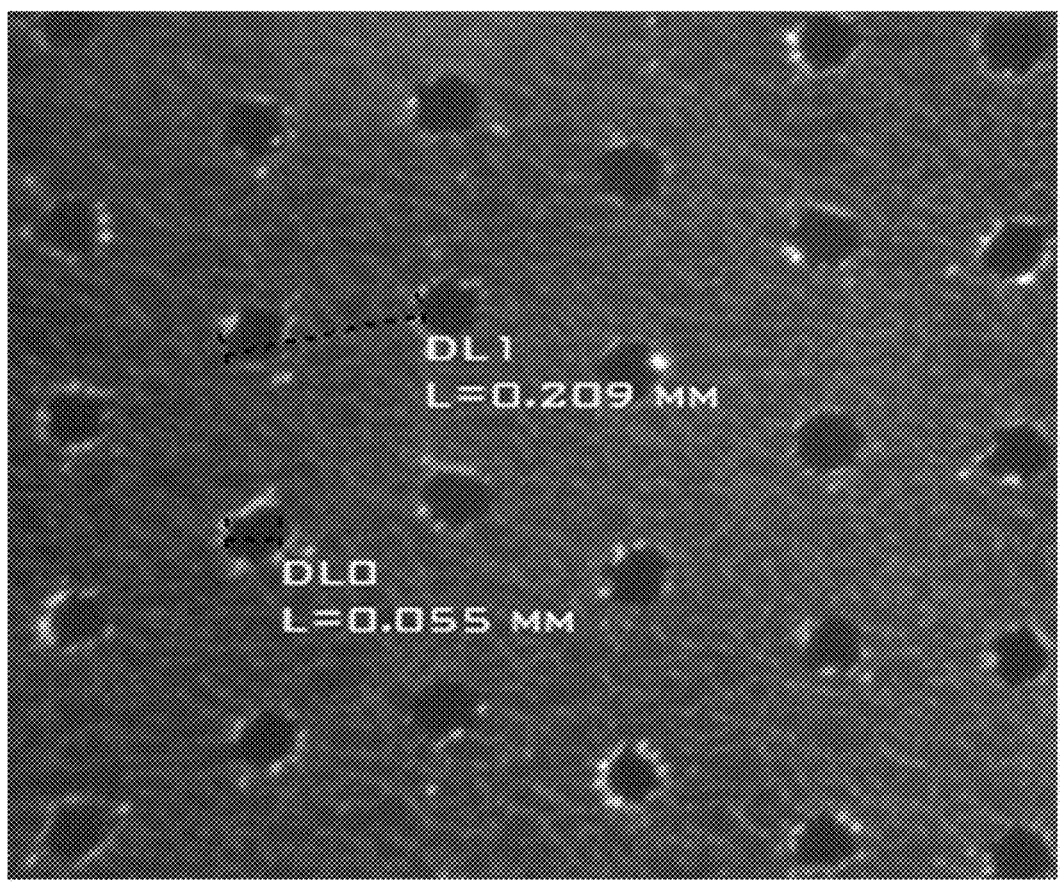
FIG. 17 is an SEM image showing a radio wave transmittable laminate according to Preparation Example of the present invention.

That is, a plurality of laminates of substrate-primer coating layer-metal layer-chromium oxide layer-black shield coating layer were prepared. The structure of the plurality of laminates prepared as described above is the same as that of the radio wave transmittable laminate shown in FIG. 11. The plurality of laminates prepared were black and glossy when viewed with the naked eye. FIG. 17 shows one of the plurality of laminates prepared.

Comparative Example 1

A plurality of laminates were prepared in the same manner as in Preparation Example 1 except for a hole diameter.

Experimental Example 1: Measurement of Propagation Attenuation Rate for Laminates of Preparation Example 1 and Comparative Example 1

The propagation attenuation rates for the laminates (Preparation Examples 1-1 to 1-5) prepared in Preparation Example 1 and the laminates (Comparative Examples 1-1 and 1-2) prepared in Comparative Example 1 were measured (SM5899). The results are shown in Table 1 below.

TABLE 1

| | Hole diameter (μm) | Space between holes (μm) | Thickness of metal layer (nm) | Attenuation rate (dB) |
|---|---|---|---|---|
| Preparation Example 1-1 | 1 | 209 | 50 | −1.6 |
| Preparation Example 1-2 | 55 | 209 | 50 | −1.4 |
| Preparation Example 1-3 | 100 | 209 | 50 | −1.2 |
| Preparation Example 1-4 | 150 | 209 | 50 | −1.0 |
| Preparation Example 1-5 | 200 | 209 | 50 | −0.9 |
| Comparative Example 1-1 | 0.5 | 209 | 50 | −1.9 |
| Comparative Example 1-2 | 210 | 209 | 50 | −0.8 |

Referring to Table 1, it is confirmed that when the hole diameter is 1 to 200 μm, the propagation attenuation rate of the laminate is satisfactory. Further, it is confirmed that when the hole diameter is less than 1 μm, the propagation attenuation rate of the laminate is less than a reference value (−1.8 dB).

On the other hand, when the hole diameter was 210 μm, the hole was visually recognized.

Preparation Example 2: Preparation of Metal Layers having Different Hole Diameters A plurality of laminates were prepared in the same manner as in Preparation Example 1 except that only a holes space was changed while keeping the hole diameters the same. The plurality of laminates prepared were black and glossy when viewed with the naked eye.

Comparative Example 2

A plurality of laminates were prepared in the same manner as in Preparation Example 2 except for a hole space.

Experimental Example 2: Measurement of Propagation Attenuation Rate for Laminates of Preparation Example 2 and Comparative Example 2

The propagation attenuation rates for the laminates (Preparation Examples 2-1 to 2-6) prepared in Preparation Example 2 and the laminates (Comparative Examples 2-1 and 2-2) prepared in Comparative Example 2 were measured (SM5899). The results were shown in Table 2 below.

TABLE 2

| | Hole diameter (μm) | Space between holes (μm) | Thickness of metal layer (nm) | Attenuation rate (dB) |
|---|---|---|---|---|
| Preparation Example 2-1 | 100 | 5 | 50 | −1 |
| Preparation Example 2-2 | 100 | 205 | 50 | −1.1 |
| Preparation Example 2-3 | 100 | 405 | 50 | −1.2 |
| Preparation Example 2-4 | 100 | 605 | 50 | −1.4 |
| Preparation Example 2-5 | 100 | 805 | 50 | −1.6 |
| Preparation Example 2-6 | 100 | 1000 | 50 | −1.7 |

TABLE 2-continued

|  | Hole diameter (μm) | Space between holes (μm) | Thickness of metal layer (nm) | Attenuation rate (dB) |
|---|---|---|---|---|
| Comparative Example2-1 | 100 | 3 | 50 | −0.9 |
| Comparative Example2-2 | 100 | 1100 | 50 | −1.9 |

Referring to Table 2, it is confirmed that when the space between the holes is 5 to 1000 μm, the propagation attenuation rate of the laminate is satisfactory. Further, it is confirmed that when the space between the holes is more than 1000 μm, the propagation attenuation rate of the laminate is less than a reference value (−1.8 dB).

On the other hand, it is visually confirmed that when the space between the holes was 3 μm, the gloss and the metal texture were weakened.

Preparation Example 3: Preparation of Metal Layer with Micro Cracks

In the same manner as in Preparation Example 1, a substrate-primer coating layer-metal layer was prepared.

Next, a temperature in a vacuum chamber was set to 15° C. so that a plurality of micro cracks were formed in the metal layer (low temperature heat treatment).

Next, in the same manner as in Preparation Example 1, a chromium oxide layer and a black shield coating layer were formed.

Figure 18A:
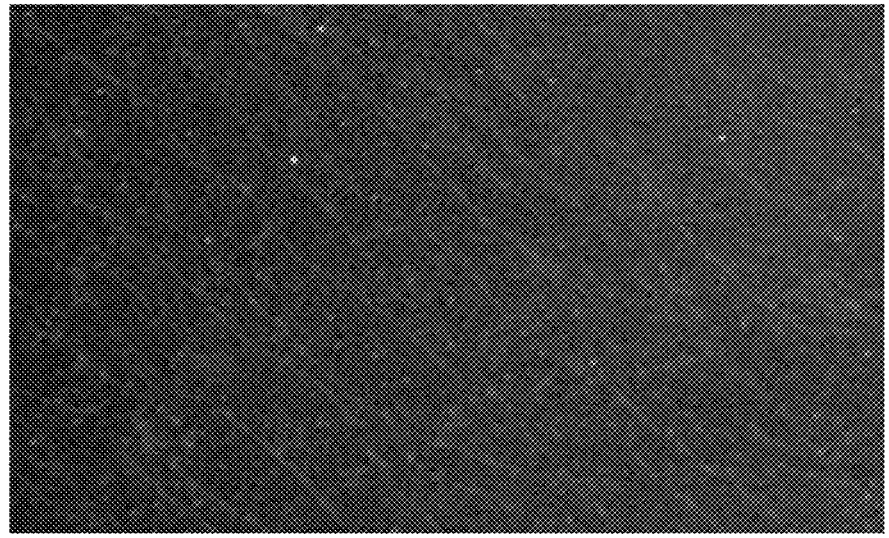
FIGS. 18(a) and 18(b) are SEM images showing the radio wave transmittable laminate according to Preparation Example of the present invention.
Figure 18B:

That is, one laminate of substrate-primer coating layer-metal layer-chromium oxide layer-black shield coating layer was prepared. The structure of the prepared laminate as described above is the same as that of the radio wave transmittable laminate shown in FIG. 11. The prepared laminate was black and glossy when viewed with the naked eye. FIG. 18(a) shows an image of the prepared laminate. FIG. 18(b) is a reference diagram for comparison with FIG. 18(a), which shows an image of a laminated prepared without a low-temperature heat treatment. Referring to FIG. 18(a), it is confirmed that micro cracks are formed by low-temperature heat treatment.

Experimental Example 3: Measurement of Propagation Attenuation Rate for Laminate of Preparation Example 3

The propagation attenuation factor for the laminate prepared in Preparation Example 3 was measured (SM5899). The results are shown in Table 3 below.

TABLE 3

|  | Line width of micro crack (μm) | Space between micro cracks (μm) | Thickness of metal layer (nm) | Attenuation rate (dB) |
|---|---|---|---|---|
| Preparation Example 3 | 0.1~80 | 5~1000 | 50 | −0.8 |

Referring to Table 3, it is confirmed that the propagation attenuation rate of the laminate is higher than a reference value (−1.8 dB) and satisfactory.

Figure 19:
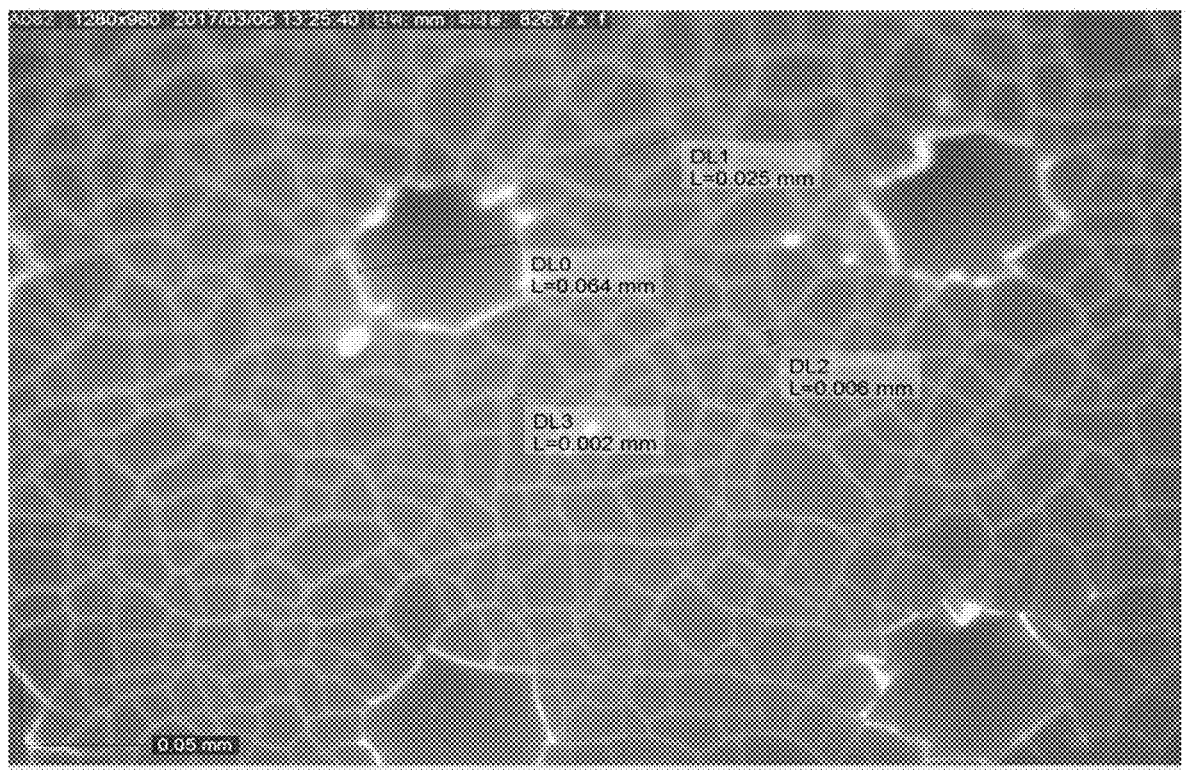
FIG. 19 is an optical microscopic image showing the radio wave transmittable laminate according to Preparation Example of the present invention.

Preparation Example 4: Preparation of Metal Layers with Micro Cracks and Different Hole Diameters A plurality of laminates were prepared by changing only the hole diameter as in Preparation Example 1. However, the formation of the metal layer before laser punching proceeded in the same manner as in Preparation Example 3. That is, a plurality of laminates including a metal layer on which the micro cracks and the hole pattern were formed were produced. The plurality of laminates prepared were black and glossy when viewed with the naked eye. FIG. 19 shows an image of one of the plurality of laminates prepared.

Experimental Example 4: Measurement of Propagation Attenuation Rates for Laminates of Preparation Example 4

The propagation attenuation rates for laminates (Preparation Examples 4-1 to 4-5) prepared in Preparation Example 4 were measured (SM5899). The results were shown in Table 4 below.

TABLE 4

|  | Line width of micro crack (μm) | Space between micro cracks (μm) | Hole diameter (μm) | Space between holes (μm) | Thickness of metal layer (nm) | Attenuation rate (dB) |
|---|---|---|---|---|---|---|
| Preparation Example 4-1 | 0.1~80 | 5~1000 | 1 | 209 | 50 | −0.69 |
| Preparation Example 4-2 | 0.1~80 | 5~1000 | 64 | 209 | 50 | −0.67 |
| Preparation Example 4-3 | 0.1~80 | 5~1000 | 100 | 209 | 50 | −0.65 |
| Preparation Example 4-4 | 0.1~80 | 5~1000 | 150 | 209 | 50 | −0.64 |
| Preparation Example 4-5 | 0.1~80 | 5~1000 | 200 | 209 | 50 | −0.63 |

Comparing Tables 1, 3, and 4, it is confirmed that when both the hole pattern and the micro cracks are formed (Table 4), the propagation attenuation rate is lower and the radio wave transmissivity is more excellent than when only the hole pattern is formed on the metal layer (Table 1) and when only the micro cracks are formed (Table 3).

Preparation Example 5: Preparation of Metal Layers with Micro Cracks and Different Spaces between Holes A plurality of laminates were prepared by changing only spaces between holes as in Preparation Example 2. However, the formation of the metal layer before laser punching proceeded in the same manner as in Preparation Example 3. That is, a plurality of laminates including a metal layer on which the micro cracks and the hole pattern were formed were produced. The plurality of laminates prepared were black and glossy when viewed with the naked eye.

Experimental Example 5: Measurement of Propagation Attenuation Rates for Laminates of Preparation Example 5

The propagation attenuation rates for laminates (Preparation Examples 5-1 to 5-6) prepared in Preparation Example 5 were measured (SM5899). The results were shown in Table 5 below.

TABLE 5

|  | Line width of micro crack (μm) | Space between micro cracks (μm) | Hole diameter (μm) | Space between holes (μm) | Thickness of metal layer (nm) | Attenuation rate (dB) |
| --- | --- | --- | --- | --- | --- | --- |
| Preparation Example 5-1 | 0.1~80 | 5~1000 | 100 | 5 | 50 | −0.63 |
| Preparation Example 5-2 | 0.1~80 | 5~1000 | 100 | 205 | 50 | −0.64 |
| Preparation Example 5-3 | 0.1~80 | 5~1000 | 100 | 405 | 50 | −0.65 |
| Preparation Example 5-4 | 0.1~80 | 5~1000 | 100 | 605 | 50 | −0.67 |
| Preparation Example 5-5 | 0.1~80 | 5~1000 | 100 | 805 | 50 | −0.69 |
| Preparation Example 5-6 | 0.1~80 | 5~1000 | 100 | 1000 | 50 | −0.71 |

Comparing Tables 2, 3, and 5, it is confirmed that when both the hole pattern and the micro cracks are formed (Table 5), the propagation attenuation rate is lower and the radio wave transmissivity is more excellent than when only the hole pattern is formed on the metal layer (Table 2) and when only the micro cracks are formed (Table 3).

CONCLUSION

First, from Preparation Examples 1 to 5, it is confirmed that the prepared radio wave transmittable laminates were black and glossy and had continuity with the surroundings.

Second, from Experimental Examples 1 and 2, it is confirmed that a hole pattern having a hole diameter of 1 to 200 μm and an space between holes of 5 to 1000 μm is most preferable in terms of radio wave transmissivity.

Third, from Experimental Examples 4 and 5, it is confirmed that when the hole pattern and the micro cracks are both formed in the metal layer, the hole pattern and the micro cracks exhibit a synergy effect that further improves the radio wave transmissivity of the radio wave transmittable laminate.

Fourth, from Experimental Examples 1 to 5, it is confirmed that there is no limitation of the metal layer material because the radio wave transmissivity may be secured without using conventional indium, tin or gallium.

The present invention has bee described with reference to the exemplary embodiments illustrated in the drawings, but this is just exemplary and it will be appreciated by those skilled in the art that various modifications and other exemplary embodiments equivalent thereto can be made therefrom. Accordingly, the true technical scope of the present invention should be defined by the appended claims.

REFERENCE SIGNS LIST

1: Radio wave transmittable laminate, sensor cover
10: Substrate
20: Metal layer
21: Hole
22: Micro crack
30: Primer coating layer
40: Chromium oxide layer
50: Black shield coating layer
60: Crack inducing layer

The invention claimed is:

1. A manufacturing method of a radio wave transmittable sensor cover, the manufacturing method comprising:
   preparing a substrate made of polycarbonate (PC), polymethylmethacrylate (PMMA), polyethylene terephthalate (PET), polyethylene naphthalate (PEN), polyimide (PI), cycloolefin polymer (COP), polyether sulfone (PES), polyetheretherketone (PEEK), polyarylate (PAR), an acrylonitrile butadiene styrene (ABS) resin, or a silicone resin;
   forming a primer coating layer on an upper surface of the substrate by coating, dipping or spraying a mixture containing a polymer resin;
   forming a metal layer on an upper surface of the primer coating layer by depositing a metal through a physical vapor deposition or chemical vapor deposition at a first temperature such that the deposited metal is grown to columnar crystals in a vertical direction of the substrate and the columnar crystals are bound to each other to form a columnar structure;
   heat treating the substrate combined with the primer coating layer and the metal layer at a second temperature which is lower than the first temperature such that a plurality of cracks are formed on the metal layer by a difference in thermal stress between the substrate and the metal layer, a line width of each of the plurality of cracks being 0.1 to 80 μm; and
   removing binding portions between the columnar crystals by forming a hole pattern including a plurality of holes vertically penetrating the metal layer at the binding portions by a laser punching to form an island structure, the plurality of holes being formed to be regularly arranged.

2. The manufacturing method of claim 1, wherein a space between adjacent cracks among the plurality of cracks is 5 to 1000 μm.

3. The manufacturing method of claim 1, wherein a diameter of each of the plurality of holes is 1 to 200 μm.

4. The manufacturing method of claim 1, wherein a space between adjacent holes among the plurality of holes is 5 to 1000 μm.

5. The manufacturing method of claim 1, wherein a thickness of the metal layer is 1 to 100 nm.

6. The manufacturing method of claim 1, wherein a difference between the first temperature and the second temperature is 10° C. or higher.

7. The manufacturing method of claim 1, further comprising forming a chromium oxide layer on an upper surface of the metal layer, wherein the chromium oxide layer is made of chromium oxide.

8. The manufacturing method of claim 7, further comprising forming a black shield coating layer on an upper surface of the chromium oxide layer, wherein the black shield coating layer is made of a black pigment.

* * * * *